(12) United States Patent
Kaneko

(10) Patent No.: US 7,155,090 B2
(45) Date of Patent: Dec. 26, 2006

(54) OPTICAL DEVICE AND METHOD FOR MANUFACTURING THE SAME, OPTICAL MODULE, AND OPTICAL TRANSMISSION DEVICE

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/894,051

(22) Filed: Jul. 20, 2004

(65) Prior Publication Data

US 2005/0047718 A1 Mar. 3, 2005

(30) Foreign Application Priority Data

Aug. 1, 2003 (JP) .............................. 2003-284993

(51) Int. Cl.
G02B 6/10 (2006.01)
(52) U.S. Cl. ..................... 385/33; 385/129; 385/130; 385/131; 472/162
(58) Field of Classification Search ................. 385/14, 385/33, 129–132; 65/385; 472/162
See application file for complete search history.

(56) References Cited

U.S. PATENT DOCUMENTS

| | | | |
|---|---|---|---|
| 3,760,237 A | | 9/1973 | Jaffe |
| 3,875,532 A | | 4/1975 | Kobayashi et al. |
| 4,501,637 A | | 2/1985 | Mitchell et al. |
| 5,472,886 A | * | 12/1995 | Dautartas et al. .............. 438/29 |
| 5,707,684 A | * | 1/1998 | Hayes et al. ................. 427/162 |
| 6,106,622 A | * | 8/2000 | Wen ............................ 118/668 |
| 2002/0044582 A1 | | 4/2002 | Kondo |
| 2002/0176468 A1 | | 11/2002 | Kaneko |
| 2002/0181536 A1 | | 12/2002 | Jeon |

FOREIGN PATENT DOCUMENTS

| | | |
|---|---|---|
| EP | 0 975 072 A2 | 1/2000 |
| EP | 1 263 098 A2 | 12/2002 |
| EP | 1 265 327 A2 | 12/2002 |
| EP | 1 341 278 A1 | 9/2003 |
| JP | A-62-67887 | 3/1987 |
| JP | A-64-84758 | 3/1989 |
| JP | A-3-142975 | 6/1991 |
| JP | A-7-7184 | 1/1995 |
| JP | A-9-307144 | 11/1997 |
| JP | A-11-100233 | 4/1999 |
| JP | 2000-002802 | 1/2000 |
| JP | 2000-067449 | 3/2000 |
| JP | 2000-075106 | 3/2000 |
| JP | 2001-066299 | 3/2001 |

(Continued)

OTHER PUBLICATIONS

The 63$^{rd}$ The Japan Society of Applied Physics Annual Meeting, Sep. 2002, Collection of Manuscripts, "Radiation angle of VCSEL controlled by Inkjet-microlens", Seiko Epson Corporation, S Kito et al. (with translation).

Primary Examiner—Michelle Connelly-Cushwa
Assistant Examiner—James D. Stein
(74) Attorney, Agent, or Firm—Oliff & Berridge, PLC

(57) ABSTRACT

Exemplary embodiments of the present invention provide optical devices including optical members whose disposed positions, shapes and sizes are excellently controlled, and methods for manufacturing the same, and to provide optical modules and optical transmission devices that include the aforementioned optical devices. An optical device of the exemplary embodiments of the present invention include a device section having an optical surface, a pointed section provided in a manner to surround the optical surface, and an optical member having at least one section that is provided on the optical surface.

8 Claims, 19 Drawing Sheets

FOREIGN PATENT DOCUMENTS

| | | |
|---|---|---|
| JP | A-2002-198613 | 7/2002 |
| JP | A-2002-372921 | 12/2002 |
| JP | 2003-258380 | 9/2003 |
| JP | 2004-117660 | 4/2004 |
| JP | 2004-119581 | 4/2004 |

* cited by examiner

F I G. 2 3
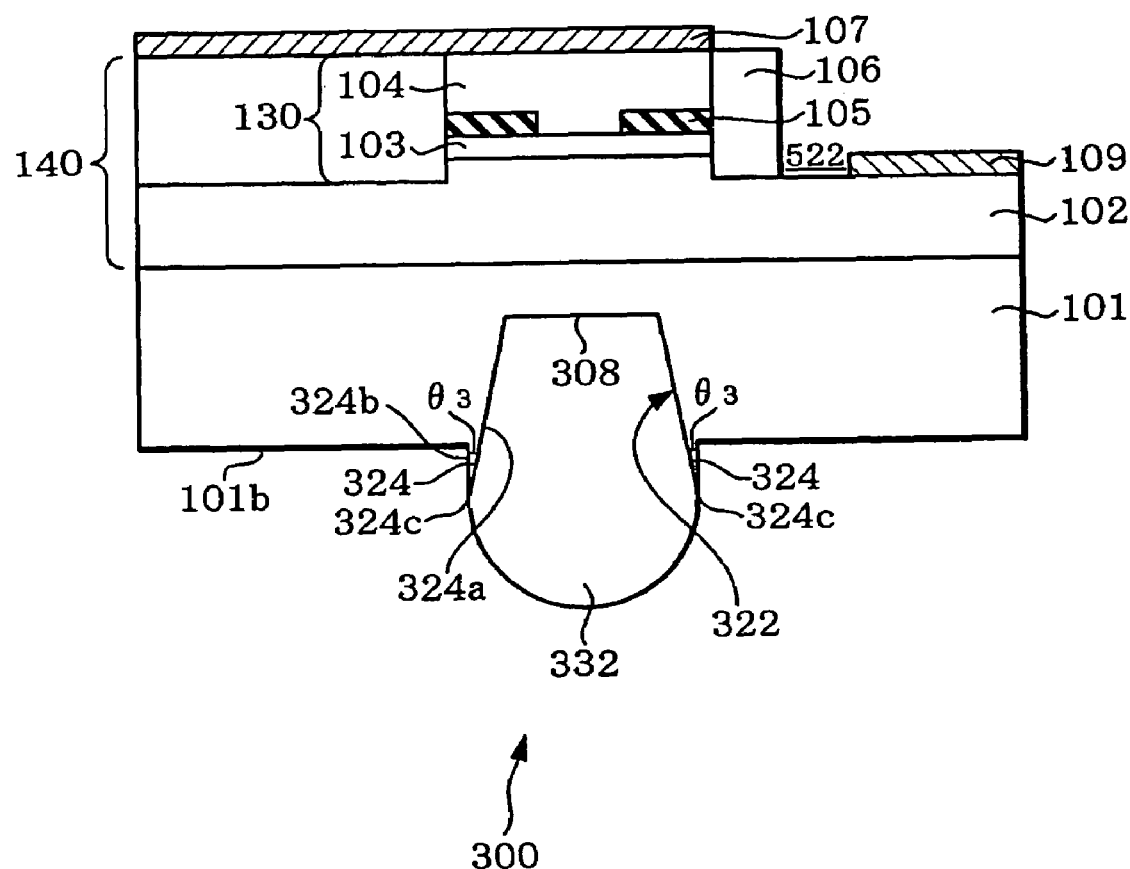

OPTICAL DEVICE AND METHOD FOR MANUFACTURING THE SAME, OPTICAL MODULE, AND OPTICAL TRANSMISSION DEVICE

BACKGROUND OF THE INVENTION

1. Field of Invention

The present invention relates to optical devices including optical members whose displaced positions, shapes and sizes are excellently controlled, and methods for manufacturing the same. Also, the present invention relates to optical modules and optical transmission devices that include the aforementioned optical devices.

2. Description of Related Art

As one of the methods to manufacture optical members such as lenses, for example, the related art includes a method for manufacturing an optical member by jetting droplets composed of liquid material on a substrate and then hardening the same. For example, related art document Japanese Laid-open Patent Application 2000-2802 discloses a method to manufacture a micro lens through jetting droplets by using an ink jet head. According to the related art, before jetting droplets, liquid repelling treatment or lyophilic treatment is performed on a region where the droplets are going to impact. However, according to the related art, there may be cases where strict control over the shape and forming position of the micro lens is difficult.

Also, as discussed in related art document Japanese Laid-open Patent Application 2000-75106, there is a method to manufacture a micro lens through forming a recessed section and retaining liquid for forming a micro lens in the recessed section. However, according to this manufacturing method, the amount of liquid that can be retained in the recessed section is limited. In particular, when a convex micro lens is manufactured, the size of the lens that can be formed is limited.

SUMMARY OF THE INVENTION

Exemplary embodiments of the present invention provide optical devices including optical members whose disposed positions, shapes and sizes are excellently controlled, and methods for manufacturing the same.

Exemplary embodiments of the present invention also provide optical modules and optical transmission devices that include the aforementioned optical devices.

1. Optical Device

An optical device in accordance with exemplary embodiments of the present invention includes: a device section having an optical surface; a pointed section provided in a manner to surround the optical surface; and an optical member having at least one section that is provided on the optical surface.

In exemplary embodiments of the present application, a "pointed section" is a section that is pointed. Also, an "optical surface" is a surface which light passes. The "optical surface" can be a plane at which light is emitted outwardly from an optical device of exemplary embodiments of the present invention, or a plane of incidence at which light is incident upon an optical device of the present invention. Also, an "outside" is a region other than an optical device of the present invention. Furthermore, an "optical member" is a member that has a function to change characteristics of light and/or its travel direction.

Also, a "pointed section provided in a manner to surround an optical surface" means that the optical surface is provided in at least one part of a region that is surrounded by the pointed section.

With the optical device in accordance with exemplary embodiments of the present invention having the aforementioned structure, an optical device including an optical member whose disposed position, shape and size are excellently controlled can be obtained through controlling the shape and height of the pointed section. This will be described in detail in exemplary embodiments of the present invention.

The optical device in accordance with exemplary embodiments of the present invention can assume the following exemplary embodiments (A) through (H):

(A) A tip of the pointed section can be located at a position higher than the optical surface.

(B) The pointed section can include a first surface and a second surface and an opening section formed from the first surface and the optical surface, the at least one section of the pointed section being provided in the opening section.

(C) An apex of the optical member can be located at a position higher than the tip of the pointed section.

The optical member can function as a lens.

In this case, the tip of the pointed section can define a circle or an oval, the optical member can have a cross section that is circular or oval, and a center of the optical surface can concur with a center of the circle or the oval defined by the pointed section.

(E) The device section can include a columnar portion, an upper surface of the columnar portion can include the optical surface, a side wall of the columnar portion can be covered with a dielectric layer, an upper section of the dielectric layer can define at least one part of the pointed section, and the pointed section can be provided to surround the upper surface of the columnar portion.

(F) At least a part of the pointed section can be provided in one piece with the device section.

(G) The optical member can be formed by hardening liquid material that can be hardened by application of energy.

(H) The optical device can be one of a surface-emitting type semiconductor laser, a semiconductor light emission diode, an organic LED and a photo diode.

2. Method for Manufacturing Optical Device

A method for manufacturing an optical device in accordance with exemplary embodiments of the present invention includes:

(a) forming a device section having an optical surface;

(b) forming a pointed section that surrounds the optical surface;

(c) forming an optical member precursor by jetting droplets to the optical surface; and (d) forming an optical member by hardening the optical member precursor.

By the method for manufacturing an optical device in accordance with exemplary embodiments of the present invention, the shape and height of the pointed section can be adjusted in the above step (b), and the optical device including an optical member whose disposed position, shape and size can be excellently controlled can be formed in the above step (c) by adjusting the amount of droplets to be ejected. Details thereof will be described in exemplary embodiment of the present invention.

The method for manufacturing an optical device in accordance with exemplary embodiments of the present invention can assume the following exemplary embodiments (A) and (B):

(A) In the step (c), jetting of the droplets can be conducted by an ink jet method. It is noted here that the "ink jet method" is a method that uses an ink jet head to jet droplets. However, in this case, droplets to be jetted are not so-called ink that is used for printed matter, but liquid substance (liquid material) including row material of the optical member. According to this exemplary method, the amount of droplets to be jetted can be finely adjusted, such that minute optical member precursor can be readily disposed on the optical surface.

(B) In the step (d), hardening of the optical member precursor can be conducted by application of energy.

3. Optical Module and Optical Transmission Device

An optical module in accordance with exemplary embodiments of the present invention includes a surface-emitting type light emitting device and an optical waveguide path. Also, an optical transmission device in accordance with exemplary embodiments of the present invention includes the optical module.

BRIEF DESCRIPTION OF THE DRAWINGS

FIG. 23 is a schematic cross-sectional view showing an optical device in accordance with a third exemplary embodiment of the present invention;

DETAILED DESCRIPTION OF PREFERRED EMBODIMENTS

Exemplary embodiments of the present invention will be described below with reference to the accompanying drawings.

First Exemplary Embodiment

1. Configuration of Optical Device

Figure 1:
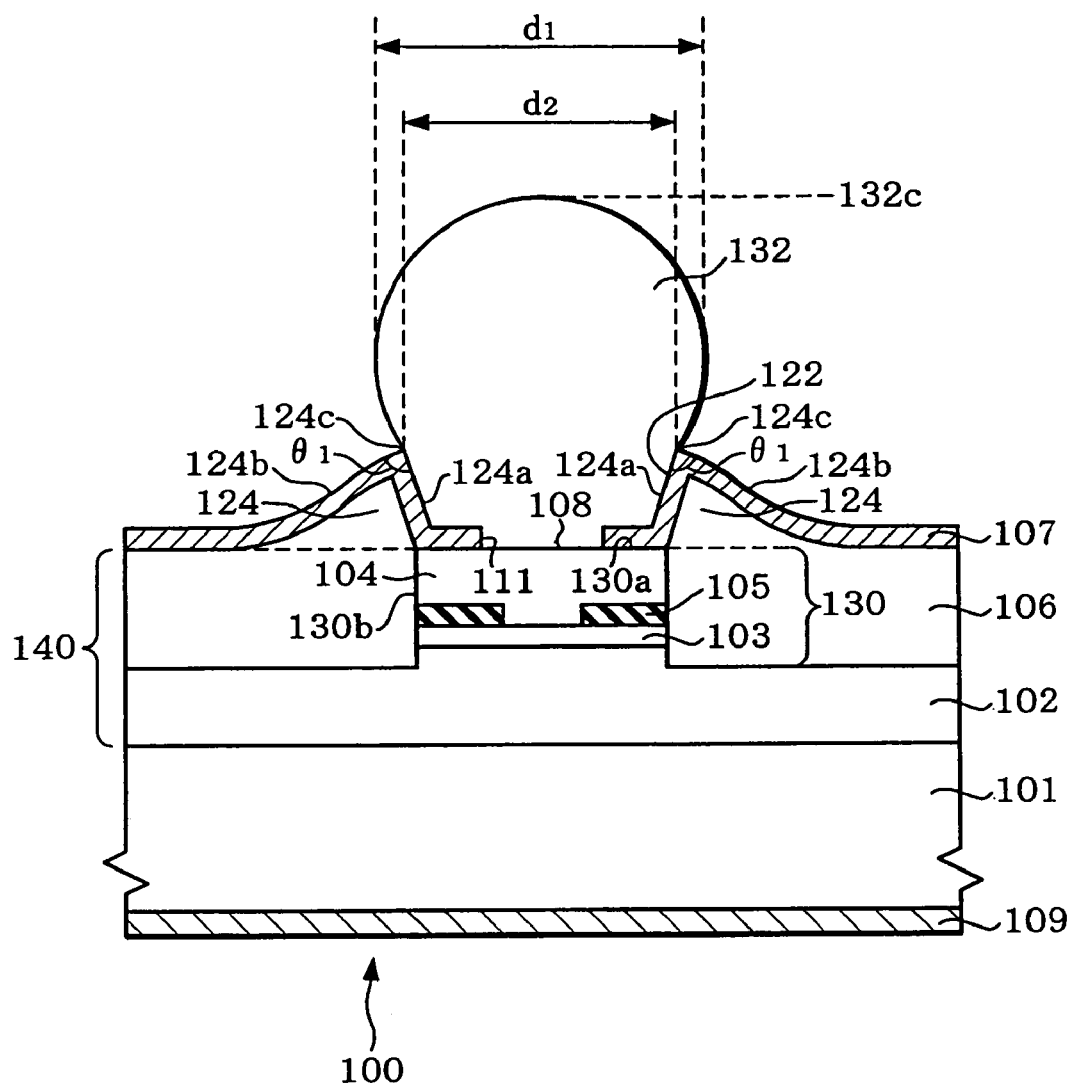
FIG. 1 is a schematic cross-sectional view showing an optical device in accordance with a first exemplary embodiment of the present invention.
Figure 2:
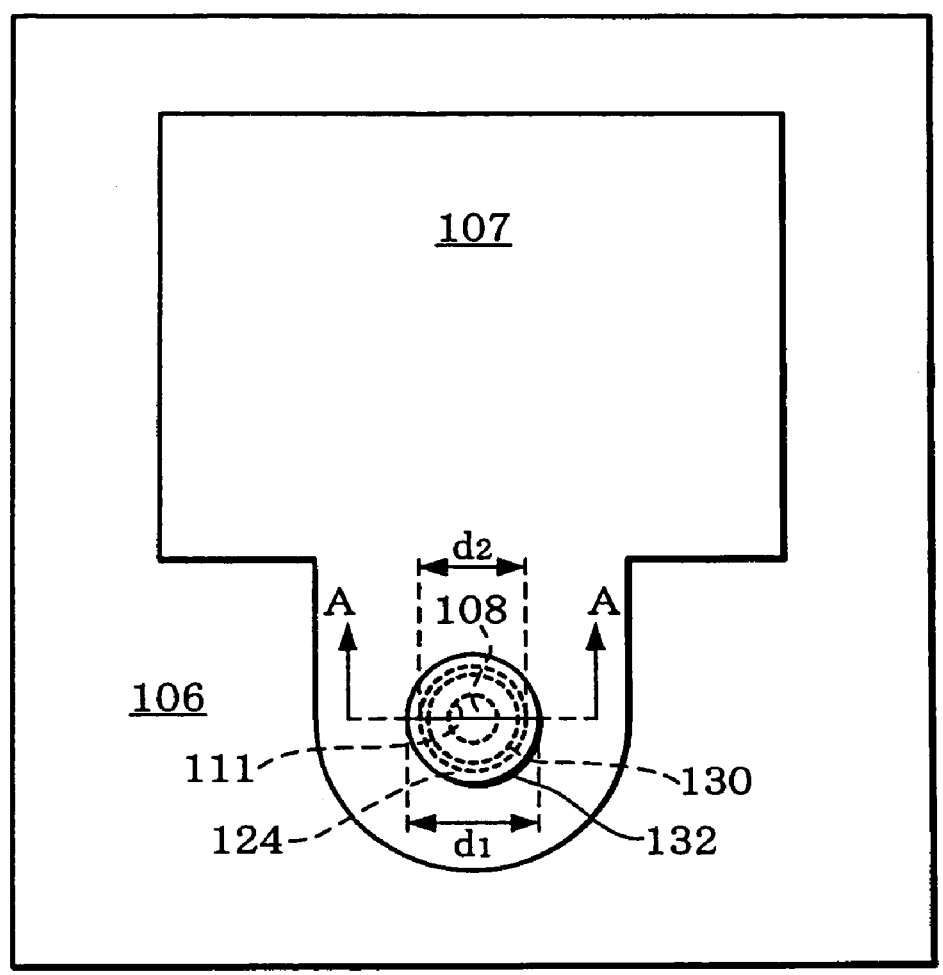
FIG. 2 is a schematic plan view showing the optical device in FIG. 1.

FIG. 1 is a schematic cross-sectional view showing an optical device 100 in accordance with an exemplary embodiment of the present invention. FIG. 2 is a schematic plan view showing the optical device 100 shown in FIG. 1. It is noted that FIG. 1 is a schematic view showing a cross section taken along a line A—A in FIG. 2.

The optical device 100 of the present exemplary embodiment includes a device section 140 having an optical surface 108, a pointed section 124 provided in a manner to surround the optical surface 108, and an optical member 132 having at least a part that is provided on the optical surface 108. It is noted that, in the present exemplary embodiment, an example in which the optical device 100 is a surface-emitting type semiconductor laser will be described. First, each of the components of the optical device 100 in accordance with the present exemplary embodiment will be described.

[Device Section]

In the optical device 100 of the present exemplary embodiment, the device section 140 is provided on a semiconductor substrate 101. The device section 140 is a vertical resonator (hereafter called an "resonator"), and can include a columnar portion 130. The semiconductor substrate 101 is formed from an n-type GaAs.

The optical surface 108 is included in a part of an upper surface 130a of the columnar portion 130. With the optical device 100, laser light is emitted from the optical surface 108. Also, in the optical device 100, a portion among the upper surface 130a of the columnar portion 130 which is not covered by a first electrode 107 defines a recessed section 111, and a bottom surface of the recessed section 111 defines the optical surface 108.

Next, each of the elements composing the device section 140 will be described.

The columnar portion 130 is a part of the device section 140, and is a columnar semiconductor deposited body including at least a second mirror 104. The columnar portion 130 is embedded by a dielectric layer 106. In other words, a side wall 130b of the columnar portion 130 is covered by the dielectric layer 106. Further, the first electrode 107 is formed over the columnar portion 130.

The device section 140 is formed from, for example, a distributed reflection type multilayer mirror of 40 pairs of alternately laminated n-type $Al_{0.9}Ga_{0.1}As$ layer and n-type $Al_{0.15}Ga_{0.85}As$ layer (hereafter called a "first mirror") 102, an active layer 103 composed of GaAs well layers and $Al_{0.3}Ga_{0.7}As$ barrier layers in which the well layers include a quantum well structure composed of three layers, and a distributed reflection type multilayer mirror of 25 pairs of alternately laminated p-type $Al_{0.9}Ga_{0.1}As$ layer and p-type $Al_{0.15}Ga_{0.85}As$ layer (hereafter called a "second mirror") 104, which are successively stacked in layers. It is noted that the composition and the number of layers composing the first mirror 102, the active layer 103 and the second mirror 104 are not limited to those specified above.

The second mirror 104 is formed to be p-type by, for example, doping C, and the first mirror 102 is formed to be n-type by, for example, doping Si. Accordingly, the second mirror 104, the active layer 103 in which no impurity is doped, and the first mirror 102 forms a pin diode.

Also, a portion among the device section 140 extending from a laser emitting side of the optical device 100 to an intermediate point of the first mirror 102 is etched in a circular shape, as viewed from the laser emitting side, to form the columnar portion 130. It is noted that, in the present exemplary embodiment, the columnar portion 130 has a plan configuration that is circular, but can have any arbitrary configuration.

Further, a current aperture layer 105, which is composed of aluminum oxide as a principal ingredient, is formed in a region near the active layer 103 among the layers composing the second mirror 104. The current aperture layer 105 is formed in a ring shape. In other words, the current aperture layer 105 has cross sections that are concentric when cut in a plane parallel with the optical surface 108.

Also, the optical device 100 is provided with a dielectric layer 106 in a manner to cover a side wall 130b of the columnar portion 130 and an upper surface of the first mirror 102.

The first electrode 107 is formed on the dielectric layer 106 and an upper surface 130a of the columnar portion 130. The first electrode 107 is formed from a stacked layered film composed of an alloy of Au and Zn, and Au, for example. Further, a second electrode 109 is formed on a back surface 101b of the semiconductor substrate 101. In the optical device 100, the first electrode 107 connects to the columnar portion 130 at the upper surface 130 thereof, and the second electrode 109 connects to the semiconductor substrate 101 at its back surface, wherein a current is injected to the active layer 103 through the first electrode 107 and the second electrode 109. The second electrode 109 is formed from a stacked layered film composed of an alloy of Au and Ge, and Au, for example.

The materials for composing the first and second electrodes 107 and 109 are not limited to those described above, and other metals, such as, for example, Ti, Pt, etc., and their alloys can be also used.

In the process of manufacturing the optical device 100, when the first electrode 107 and the second electrode 109 are formed, an anneal treatment is generally conducted at about 400° C. (see a manufacturing process to be described below). Accordingly, when the dielectric layer 106 is formed with resin, the resin that composes the dielectric layer 106 needs to have an excellent heat-resisting property to withstand the anneal treatment. To meet this requirement, the resin that composes the dielectric layer 106 may preferably be polyimide resin, fluororesin, acrylic resin, or epoxy resin, and more particularly, it may preferably be polyimide resin or fluororesin in view of their good workability and dielectric property. In this case, the dielectric layer 106 is formed by hardening a resin precursor through setting or chemical reaction by irradiation of energy such as heat, light, and the like. Alternatively, the dielectric layer 106 may be formed from material with a high level of dielectric property, such as, silicon oxide layer, silicon nitride layer, oxinitride silicon layer, or the like.

[Optical Member]

The optical member 132 allows the passage of light with a specified wavelength. The optical member 132 may have a function of light condensation, deflection or spectral diffraction. It is noted that the "passage" here means that, light incident upon the optical member 132, after its incidence, goes out from the optical member 132, and includes cases where light incident upon the optical member 132 entirely goes out from the optical member 132, and cases where light incident upon the optical member 132 partially goes out from the optical member 132.

(Three-Dimensional Configuration of Optical Member)

The optical member 132 can function as a lens. In this case, preferably, a tip 124c of the pointed section 124 may define a circular shape or an oval shape, the cross section of the optical member 132 may be circular or oval, and the center of the optical surface 108 may preferably concur with the center of the circle or the oval defined by the tip 124c of the pointed section 124. This similarly applies to pointed sections and optical members in other exemplary embodiments to be described below.

In accordance with the present exemplary embodiment, as shown in FIG. 2, the pointed section 124 is formed from the dielectric layer 106 and the first electrode 107 that covers the dielectric layer 106, the tip 124c of the pointed section 124 defines a circle, the cross section of the optical member 132 is circular, and the center of the optical surface 108 concurs with the center of the circle that is defined by the tip 124c of the pointed section 124.

Also, the optical device 100 of the present exemplary embodiment has an opening section 122 with its bottom surface being located at the upper surface 130a of the columnar portion 130, and the upper surface 130a of the columnar portion 130 is circular. Furthermore, as shown in FIG. 1, the optical member 132 may be formed to have a size such that an apex section 132c thereof is located at a position higher than the tip 124c of the pointed section 124, whereby the three-dimensional configuration of an upper section of the optical member 132 above the tip 124c of the pointed section 124 can be formed in a circular globe shape, or a cut circular globe shape. In this case, the optical member 132 obtained can be used as a lens or a deflection element.

In the optical device 100 of the present exemplary embodiment, as shown in FIG. 2, the cross section of the optical member 132 is circular. Also, as shown in FIG. 1 and FIG. 2, the maximum size (diameter) d1 of the optical member 132 can be greater than the maximum size (diameter) d2 of the circle that is defined by the tip 124c of the pointed section 124. Additionally d2 can be greater than the maximum size (diameter) of the upper surface 130a of the columnar portion 130.

(Material of Optical Member)

The optical member 132 may be formed by hardening liquid material that can be set by application of energy such as heat, light or the like. More specifically, the optical member 132 is formed through forming an optical member precursor (to be described below) by jetting droplets composed of the liquid material against the optical surface 108, and then hardening the optical member precursor.

The liquid material may include, for example, precursor of ultraviolet light setting type resin or heat setting type resin. As the ultraviolet light setting type resin, ultraviolet light setting type acrylic resin and epoxy resin can be listed. Also, as the heat setting type resin, heat setting type polyimide resin can be listed.

[Pointed Section]

The pointed section 124 is provided in a manner to surround the optical surface 108, and a first surface 124a of the pointed section 124 forms a side wall of the opening section 122. In the optical device 100 of the present exemplary embodiment, the pointed section 124 is provided in a manner to surround the upper surface 130a of the columnar portion 130. Also, the optical surface 108 forms a part of the bottom surface of the opening section 122. Furthermore, the optical member 132 includes a portion that is provided in the opening section 122.

In the optical device 100 of the present exemplary embodiment, a part of the pointed section 124 is provided in one piece with the dielectric layer 106. More specifically, an upper portion of the dielectric layer 106 forms a part of the pointed section 124. Accordingly, portions of the pointed section 124 excluding the first electrode 107 are made from the same material as that of the dielectric layer 106.

More specifically, as shown in FIG. 1, the pointed section 124 includes a first surface 124a and a second surface 124b. The first surface 124a and the second surface 124b define an angle $\theta_1$ that is an acute angle. Also, the second surface 124b of the pointed section 124 (i.e., the portion of the surface of the pointed section 124 which does not compose the side wall of the opening section 122) is inclined. The second surface 124b of the pointed section 124 has a shorter distance from the semiconductor substrate 101 as it goes farther from the opening section 122. In other words, in the region where the pointed section 124 is formed, the film thickness of the dielectric layer 106 including the pointed section 124 becomes smaller as it goes farther from the opening section 122. Also, the first surface 124a of the pointed section 124 forms a side wall of the opening section 122.

A point of intersection between the first surface 124a and the second surface 124b of the pointed section 124 corresponds to the tip 124c. The tip 124c of the pointed section 124 is at a position higher than the optical surface 108. In other words, the distance from the semiconductor substrate 101 to the tip 124c of the pointed section 124 is greater than the distance from the semiconductor substrate 101 to the optical surface 108. Also, the apex section 132c of the optical member 132 is located at a position higher than the tip 124c of the pointed section 124. That is, the distance from the semiconductor substrate 101 to the apex section 132c of the optical member 132 is greater than the distance from the semiconductor substrate 101 to the tip 124c of the pointed section 124.

In the exemplary embodiment described above, the case where the optical device 100 is a surface-emitting type semiconductor laser is explained as an example. However, optical devices to which exemplary embodiments of the present invention is applicable are not limited to the surface-emitting type semiconductor laser, and the present invention is also applicable to other light emission elements (for instance, semiconductor light emitting diode and organic LED) or photodetectors (for instance, photodiode).

2. Method of Manufacturing Optical Device

Next, a method of manufacturing the optical device 100 shown in FIG. 1 and FIG. 2 will be described with reference to FIG. 3 through FIG. 10. FIG. 3 through FIG. 10 are schematic cross-sectional views showing a process of manufacturing the optical device 100 shown in FIG. 1 and FIG. 2, and correspond to the cross section shown in FIG. 1.

Figure 3:
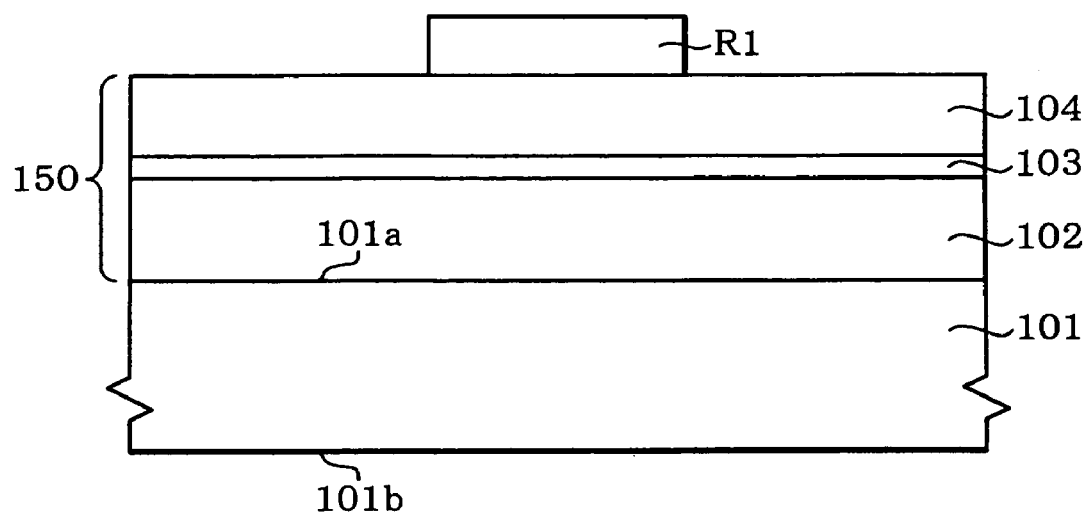
FIG. 3 is a schematic cross-sectional view showing a step of manufacturing the optical device in FIG. 1 and FIG. 2.
Figure 4:
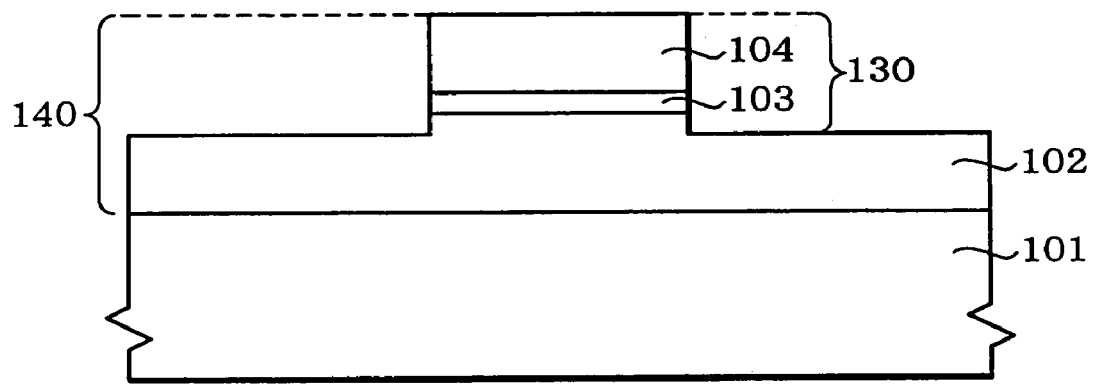
FIG. 4 is a schematic cross-sectional view showing a step of manufacturing the optical device in FIG. 1 and FIG. 2.
Figure 5:
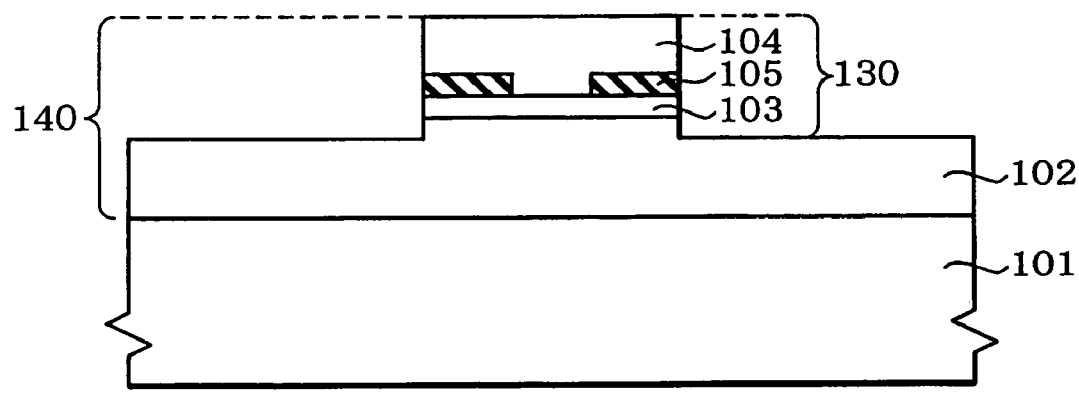
FIG. 5 is a schematic cross-sectional view showing a step of manufacturing the optical device in FIG. 1 and FIG. 2.

(1) First, a device section 140 including a columnar portion 130 is formed (see FIG. 3 through FIG. 5)

More specifically, a semiconductor multilayer film 150 (see FIG. 3) is formed on a surface of a semiconductor substrate 101 that is composed of n-type GaAs by conducting an epitaxial growth while changing the composition. It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, and a second mirror 104 of 25 pairs of alternately laminated p-type $Al_{0.9}Ga_{0.1}As$ layers and p-type $Al_{0.15}Ga_{0.85}As$ layers. These layers are successively stacked in layers on the semiconductor substrate 101, thereby forming the semiconductor multi layered film 150.

When the second mirror 104 is grown, at least one layer thereof in proximity to the active layer 103 is formed as an AlAs layer or an AlGaAs layer having Al composition that is 0.95 or greater. This layer is to be oxidized later and become a current aperture layer 105 (see FIG. 5). When the second electrode 109 is formed in a later step, at least a portion of the second mirror 104 that contacts the second electrode 109 may preferably be formed to readily have ohm contact with the second electrode 109 by increasing the carrier density of the portion.

The temperature at which the epitaxial growth is conducted is appropriately decided depending on the growth method, the kind of raw material, the type of the semiconductor substrate 101, and the kind, thickness and carrier density of the semiconductor multiple layer film 150 to be formed, and in general may preferably be 450° C.–800° C. Also, the time required when the epitaxial growth is conducted is properly decided as well as the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Next, the columnar portion 130 is formed by patterning (see FIG. 4). More specifically, first, photoresist (not shown) is coated on the second mirror 104, and then the photoresist is patterned by a photolithography method, thereby forming a resist layer R1 having a specified pattern (FIG. 3).

Next, the second mirror 104, the active layer 103 and a part of the first mirror 102 are etched by, for example, a dry etching method, using the resist layer R1 as a mask. By this, as shown in FIG. 4, the columnar portion 130 is formed. Also, through the steps conducted so far, a device section (resonator) 140 including the columnar portion 130 is formed on the semiconductor substrate 101 (see FIG. 4). Thereafter, the resist layer R1 is removed.

Next, by placing the semiconductor substrate 101 in which the columnar portion 130 is formed through the aforementioned process in a water vapor atmosphere at about 400° C., for example, the aforementioned second mirror 104 is oxidized from a side surface thereof having a higher Al composition, thereby forming the current aperture layer 105 (see FIG. 5).

The oxidation rate depends on the temperature of the furnace, the amount of water vapor supply, the Al composition of the layer to be oxidized (the layer in which the Al composition content is high), and the film thickness. In a surface-emitting type semiconductor laser that has a current aperture layer formed by oxidation, electric current flows, when it is driven, only in a portion where the current aperture layer is not formed (i.e., a portion that has not been oxidized). Therefore, the current density can be controlled by controlling the range of the current aperture layer 105 to be formed in the process of forming the current aperture layer by oxidation.

Figure 6:
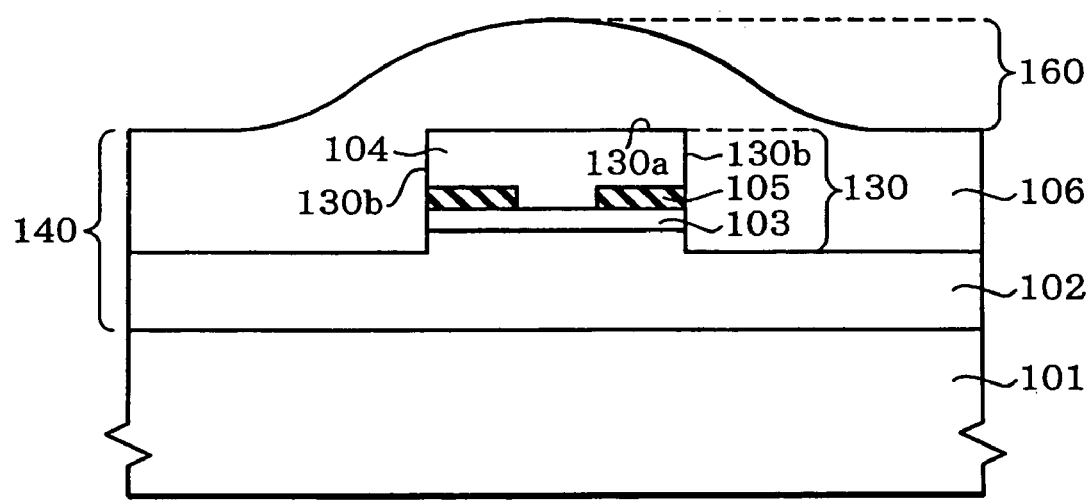
FIG. 6 is a schematic cross-sectional view showing a step of manufacturing the optical device in FIG. 1 and FIG. 2.
Figure 7:
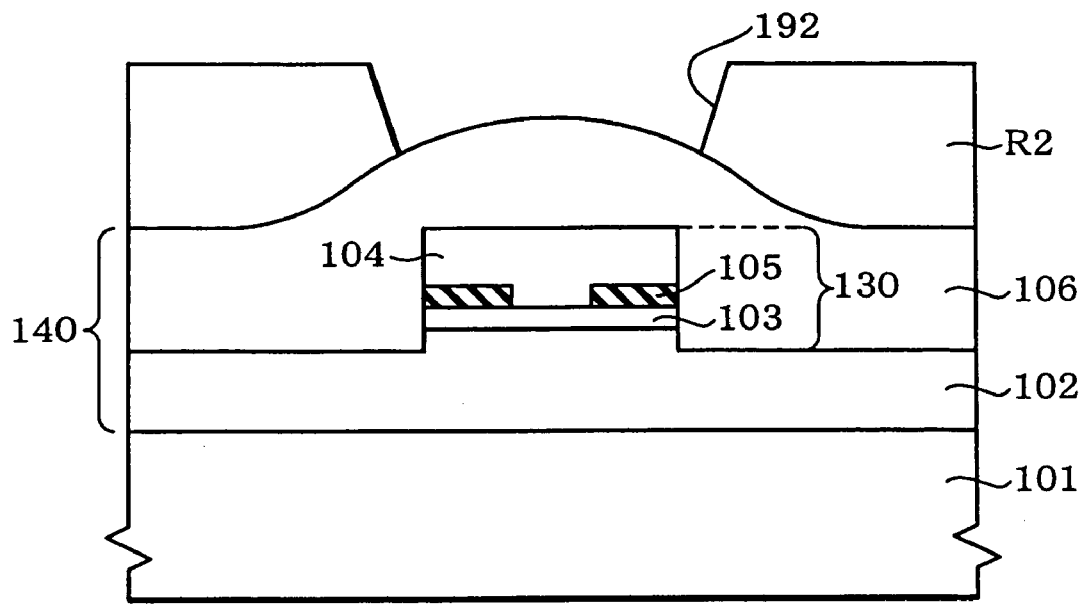
FIG. 7 is a schematic cross-sectional view showing a step of manufacturing the optical device in FIG. 1 and FIG. 2.
Figure 8:
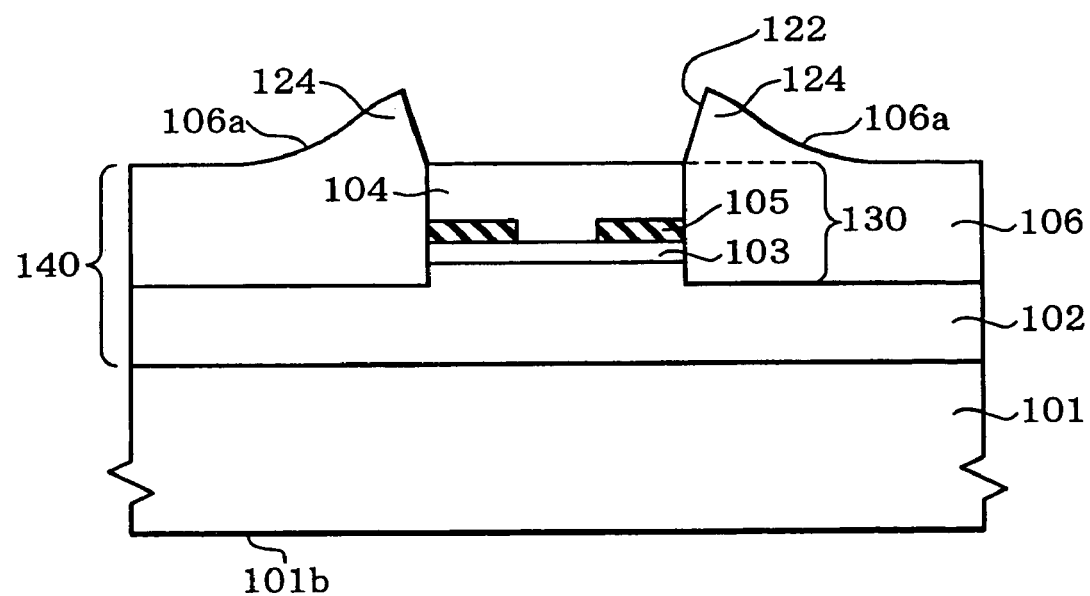
FIG. 8 is a schematic cross-sectional view showing a step of manufacturing the optical device in FIG. 1 and FIG. 2.

(2) Next, a pointed section 124 is formed (see FIG. 6 through FIG. 8).

First, an upper surface 130a and a side wall 130b of the columnar portion 130 are covered by a dielectric layer 106 (see FIG. 6). It is noted that the following description will be made as to a case in which polyimide resin is used as the material for forming the dielectric layer 106.

For example, resin precursor (polyimide precursor: not shown) is coated by using a spin coat method to cover the columnar portion 130, and then is imidized to form the dielectric layer 106 (see FIG. 6). As the method of coating the resin precursor, besides the aforementioned exemplary spin coat method, another related art technique, such as, a dipping method, a spray coat method, an ink jet method or the like can be used. It is noted that, as the method of forming the dielectric layer 106, in addition to the aforementioned method, for example, a method that is described in related art document Japanese Laid-open patent application 2001-066299, can be used.

In the present exemplary embodiment, the columnar portion 130 is provided in the device section 140, and the dielectric layer 106 is formed over the device section 140 that includes the columnar portion 130, whereby a protruded section 160 is formed by a portion of the dielectric layer 106 which is provided above the columnar portion 130 (see FIG. 6). In the present exemplary embodiment, the protruded section 160 can be used to form the pointed section 124 that surrounds the upper surface 130a of the columnar portion 130.

Also, the film thickness of the portion of the dielectric layer 106 which is provided above the upper surface 130a of the columnar portion 130 is a factor that determines the height of the pointed section 124 that is formed in a later step to be described below. Accordingly, by adjusting the film thickness of the portion of the dielectric layer 106 which is provided above the upper surface 130a of the columnar portion 130, the shape and height of the pointed section 124 can be controlled.

Next, photoresist (not shown) is coated on the dielectric layer 106, and then the photoresist is patterned by a photolithography method, thereby forming a resist layer R2 having a specified pattern (see FIG. 7). The resist layer R2 includes an opening section 192. The opening section 192 is provided in a region where an opening section 122 is formed in the dielectric layer 106 (see FIG. 8).

Next, using the resist layer R2 as a mask, the dielectric layer 106 is etched by, for example, a dry etching method. Then, the resist layer R2 is removed. By this, as shown in FIG. 8, the opening section 122 is provided in the dielectric layer 106, whereby the pointed section 124 is formed. The pointed section 124 composes an upper section of the dielectric layer 106. Also, in the present exemplary embodiment, the opening section 122 is provided over the top surface 130a of the columnar portion 130. In other words, the bottom surface of the opening section 122 defines the upper surface 130a of the columnar portion 130.

Figure 9:
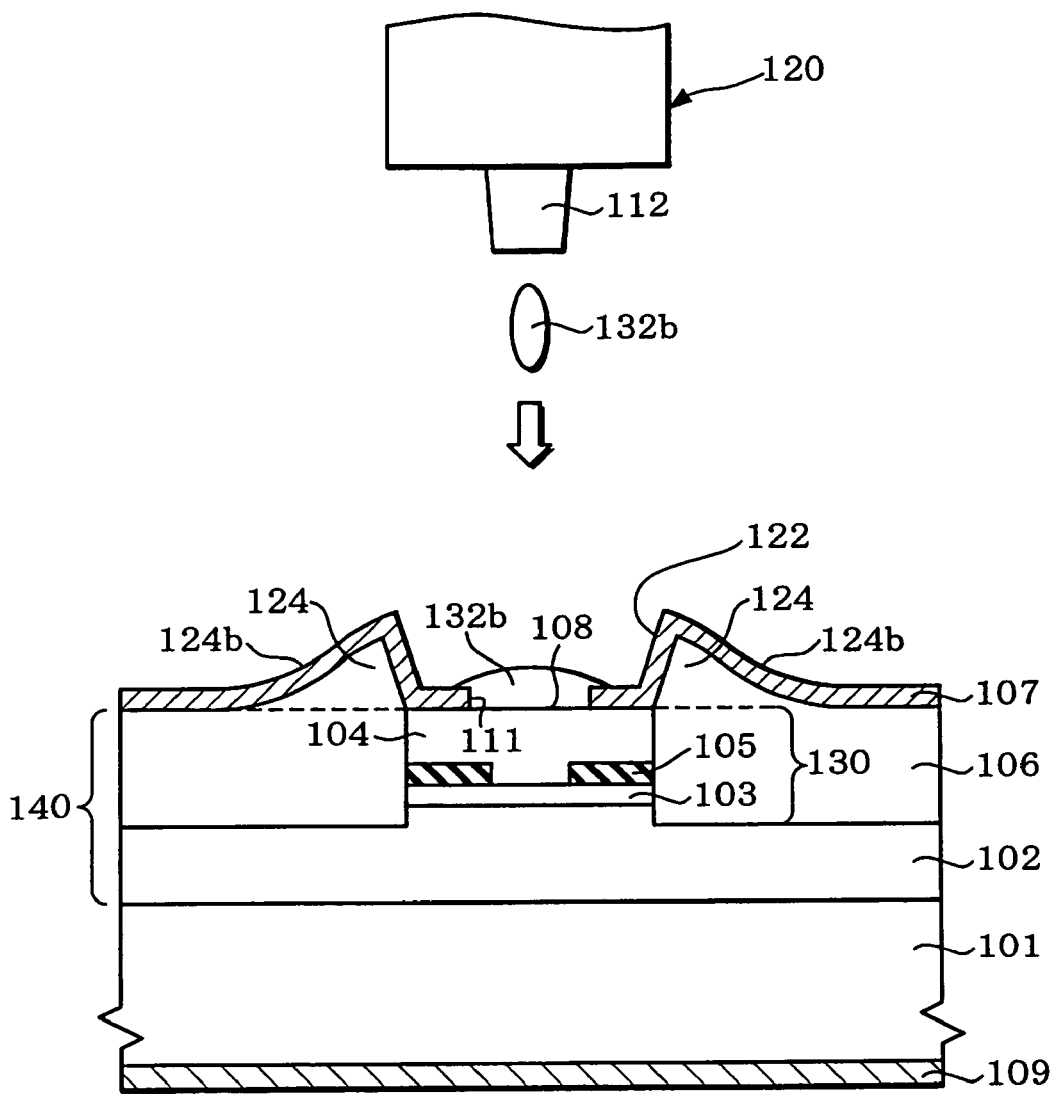
FIG. 9 is a schematic cross-sectional view showing a step of manufacturing the optical device in FIG. 1 and FIG. 2.

(3) Next, a first electrode 107 and a second electrode 109 are formed, and an optical surface 108 is provided in the device section 140 (see FIG. 9).

First, prior to forming the first electrode 107 and the second electrode 109, an upper surface 106a of the dielectric layer 106 and a back surface 101b of the semiconductor substrate 101 are washed, if necessary, by using a plasma processing method or the like. By this process, a device having a more stable characteristic can be formed.

Next, for example, by using a vacuum vapor deposition method, a stacked layered film of, for example, Au and an alloy of Au and Zn (not shown) is formed. Next, the stacked layered film other than a specified position thereof is removed by a lift-off method, thereby forming the first electrode 107 on the dielectric layer 106. In this instance, a portion where the stacked layered film is not formed is formed on the upper surface 130a of the columnar portion 130. This portion defines a recessed section 111, and the bottom surface of the recessed section 111 defines the optical surface 108. By the aforementioned process, the optical surface 108 is provided in the device section 140. It is noted that, in the aforementioned step, a dry etching method can be used instead of the lift-off method.

Next, by using a similar method, a stacked layered film of Au and an alloy of Au and Ge, for example, is patterned, thereby forming the second electrode 109 on the back surface 101b of the semiconductor substrate 101 (see FIG. 9). Then, an annealing treatment is conducted. The temperature of the annealing treatment depends on the material of the electrodes. In the case of the electrode material used in the present exemplary embodiment, it is normally conducted around 400° C. By the aforementioned process, the second electrode 109 is formed (see FIG. 9).

Figure 10:
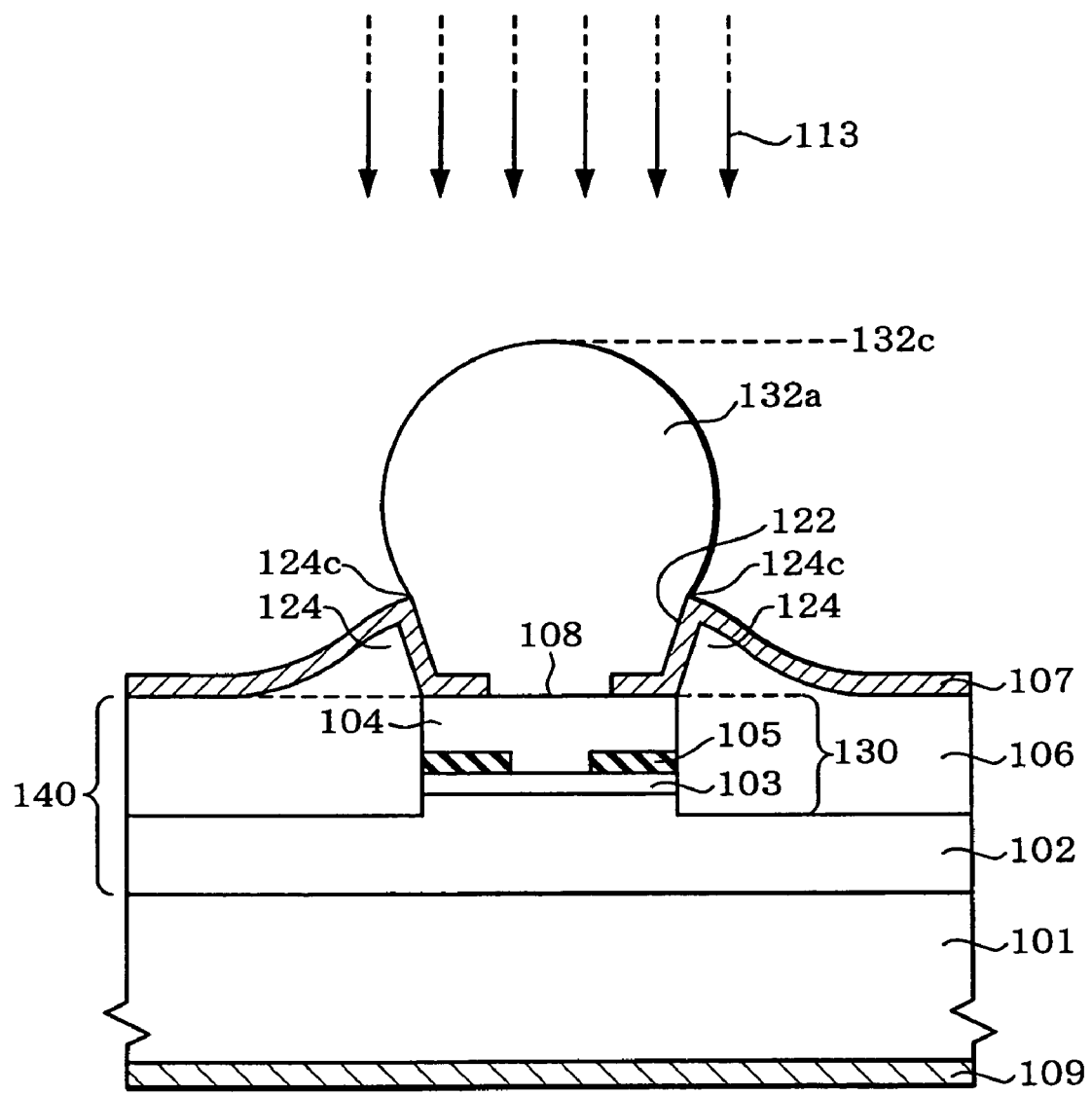
FIG. 10 is a schematic cross-sectional view showing a step of manufacturing the optical device in FIG. 1 and FIG. 2.

(4) Next, an optical member 132 is formed (see FIG. 9 and FIG. 10). More specifically, droplets 132b of liquid material for forming the optical member 132 are jetted against the optical surface 108 to form an optical member precursor 132a. As described above, the liquid material has a property to harden by application of energy.

As the method of jetting the droplets 132b, for example, a dispenser method or an ink jet method can be listed. The dispenser method is an ordinary method as a method of jetting droplets, and is effective when droplets 132b are jetted in a relatively wide area. Also, the ink jet method is a method to jet droplets using an ink jet head, and is capable of controlling the location of droplets to be jetted in the order of units in μm. Also, the amount of droplets to be jetted can be controlled in the order of units in pico liter. By using an ink jet method in the present step to thereby jet droplets, the optical member 132 with a minute structure can be fabricated. FIG. 9 shows a step in which droplets 132b are jetted from a nozzle 112 of an ink jet head 120 against the optical surface 108.

The size of the optical member precursor 132a can be controlled by adjusting the amount of droplets 132b to be jetted. Also, as shown in FIG. 10, the amount of droplets 132a is adjusted such that an apex section 132c of the optical member precursor 132a is at a position higher than the tip 124c of the pointed section 123.

A liquid repelling treatment or a lyophilic treatment is performed on the bottom and the sidewall of the opening section 122 if necessary before droplets 132b are jetted, whereby the wettability against droplets 132b can be controlled. As a result, the optical member 132 having a specified configuration and size can be formed.

Next, the optical member precursor 132a is hardened to form the optical member 132 (see FIG. 10). More specifically, energy 113 such as heat or light is applied to the optical member precursor 132a. For hardening the optical member precursor 132a, an appropriate method is to be used depending on the kind of the liquid material. For example, application of thermal energy or irradiation of light such as ultraviolet ray or laser light can be listed.

By the aforementioned process, the optical device 100 including the optical member 132 can be obtained (see FIG. 1 and FIG. 2).

3. Characteristics

The optical device 100 in accordance with the present exemplary embodiment and its manufacturing method have the following characteristics.

(1) First, since the optical member 132 includes at least a portion that is provided on the optical surface 108, the angle of emission of light that goes out from the optical surface 108 is adjusted and then the light can be emitted outside. More specifically, due to the fact that the optical member 132 is provided, the angle of emission of light generated by the device section 140 can be narrowed. By this, for example, when light emitted from the optical device 100 of the present exemplary embodiment is to be introduced into an optical waveguide path (not shown), it becomes easy to introduce the light into the optical waveguide path.

(2) Second, the optical device 100 provided with the optical member 132 having a desired configuration and a size can be obtained. In other words, in accordance with the method for manufacturing an optical device in accordance with the present exemplary embodiment, as shown in FIG. 1, the pointed section 124 is provided in a manner to surround the optical surface 108. By this, in the process of forming the optical member 132 (see FIG. 9), when the optical member precursor 132a is formed at least on the optical surface 108, the surface tension of the second surface 124b does not act on the optical member precursor 132a unless the second surface 124b of the pointed section 124 gets wet by the optical member precursor 132a, and the surface tension of the optical member precursor 132a mainly acts thereon. Accordingly, by adjusting the jetting amount of droplets 132b for forming the optical member precursor 132a, the configuration of the optical member precursor 132a can be controlled. By this, the optical member 132 having a desired configuration and a size can be obtained.

Further, in the optical device 100 of the present exemplary embodiment, a part of the pointed section 124 (a portion among the pointed section 124 excluding the fist electrode) is formed in one piece with the dielectric layer 106. In other words, a portion of the dielectric layer 106 that covers the side wall 130b of the columnar portion 130 can be used as the pointed section 124.

(3) Third, the size and configuration of the optical member 132 can be strictly controlled. In other words, the configuration of the optical member 132 can be controlled by adjusting the jetting amount of droplets 132b. Accordingly, the optical device 100 including the optical member 132 having a desired configuration and size can be obtained.

(4) Fourth, due to the fact that the pointed section 124 is provided in a manner to surround the optical surface 108, the optical member 132 can be stably disposed on the optical surface 108. In other words, the optical member 132 not only connects to the optical surface 108, but also connects to the first surface 124a (the side wall of the opening section 122) of the pointed section 124. For this reason, the optical member 132 is difficult to fall off the opening section 122. By this, the optical device 100 that is excellent in mechanical strength at connecting sections between the optical member 132 and the bottom surface and side wall of the opening section 122 can be obtained.

(5) Fifth, position alignment to be performed at the time of forming the optical member 132 is facilitated, and the placement position of the optical member 132 can be strictly controlled. As described above, the optical member 132 is formed by jetting droplets 132b against the optical surface 108 to form the optical member precursor 132a, and then hardening the optical member precursor 132a (see FIG. 9 and FIG. 10). In the above process, the optical member precursor 132a is formed through impacting droplets in a region surrounded by the pointed section 124. For this reason, the optical member 132 can be formed without performing particularly strict position alignment. By this, the optical member 132 with its disposed position well controlled can be readily obtained.

Second Exemplary Embodiment

1. Configuration of Optical Device

Figure 11:
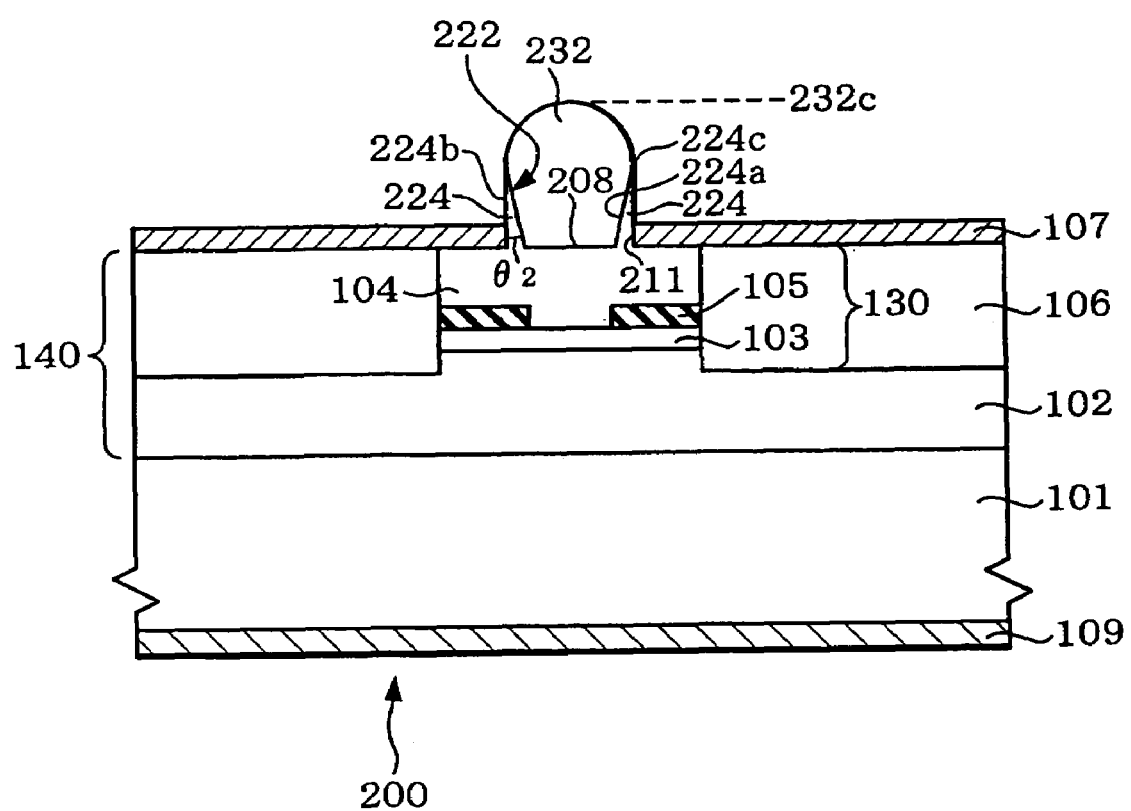
FIG. 11 is a schematic cross-sectional view showing an optical device in accordance with a second exemplary embodiment of the present invention.
Figure 12:
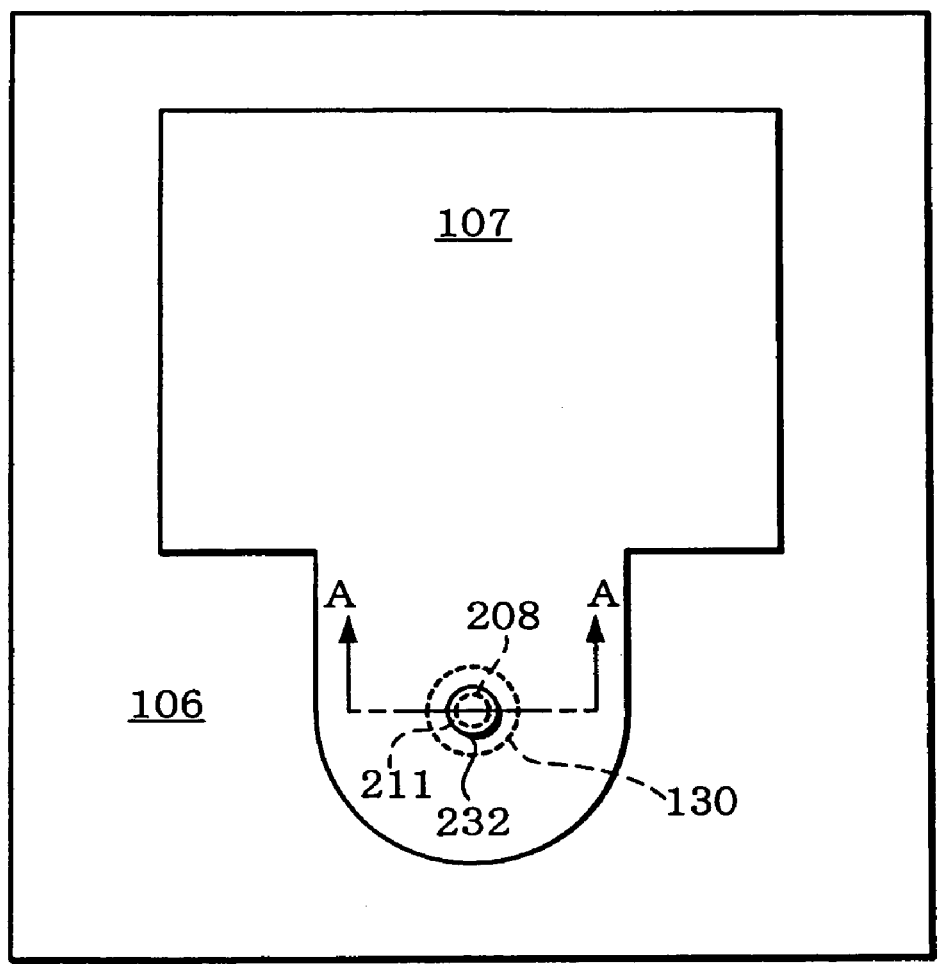
FIG. 12 is a schematic plan view showing the optical device in FIG. 11.

FIG. 11 is a schematic cross-sectional view showing an optical device 200 in accordance with an exemplary embodiment of the present invention. FIG. 12 is a schematic plan view showing the optical device 100 shown in FIG. 11. It is noted that FIG. 11 is a view indicating a cross section taken along a line A—A in FIG. 12.

The optical device 200 of the present exemplary embodiment has a structure different from that of the optical device 100 of the first exemplary embodiment (see FIG. 1 and FIG. 2) in that an optical member 232 is provided only on an optical surface 208. Other components are generally the same as those of the optical device 100 of the first exemplary embodiment. Accordingly, in the optical device 200 of the present exemplary embodiment, components similar to those of the optical device 100 shall be appended with the same reference numbers as those of the components of the first exemplary embodiment, and their detailed description shall be omitted.

The optical device 200 of the present exemplary embodiment includes a device section 140 having an optical surface 208, a pointed section 224 provided in a manner to surround the optical surface 208, and an optical member 232. The optical member 232 is provided only on the optical surface 208. More specifically, the pointed section 224 includes a first surface 224a and a second surface 224b, wherein the first surface 224a and the optical surface 208 define an opening section 232. In other words, the first surface 224a defines a side wall of the opening section 232, and the optical surface 208 defines a bottom surface of the opening section 232. Also, a tip 224c of the pointed section 224 defines a point of intersection between the first surface 224a and the second surface 224b.

Also, a part of the optical member 232 is provided in the opening section 232. An apex section 232c of the optical member 232 is provided at a position higher than the tip 224c of the pointed section 224.

The pointed section 224 includes the first surface 224a and the second surface 224b. The first surface 224a and the second surface 224b define an angle θ2 that is an acute angle. In the optical device 200 of the present exemplary embodiment, the pointed section 224 is provided in one piece with the element section 140. More specifically, the pointed section 224 is provided in one piece with a second mirror 104 of the device section 140. Also, in the optical device 200, a portion of a columnar portion 130, which is not covered by a first electrode 107, defines a recessed section 211, and the pointed section 224 is formed in the recessed section 211.

As shown in FIG. 11 and FIG. 12, the maximum size (diameter) of the circle that is defined by the tip 224c and the maximum size (diameter) of the optical member 232 can be smaller the maximum size (diameter) of the upper surface 130a of the columnar portion 130. Additionally, the maximum size (diameter) of the circle that is defined by the tip 224c and the maximum size (diameter) of the optical member 232 can be greater than inside diameter of current aperture layer 105.

2. Method of Manufacturing an Optical Device

Next, a method of manufacturing the optical device 200 shown in FIG. 11 and FIG. 12 will be described with reference to FIG. 13 through FIG. 20. FIG. 13 through FIG. 20 are schematic cross-sectional views showing a process of manufacturing the optical device 200 shown in FIG. 11 and FIG. 12, and correspond to the cross section shown in FIG. 13.

(1) First, a semiconductor multilayer film 250 (see FIG. 13) is formed on a semiconductor substrate 101. The method of forming the semiconductor multilayer film 250 is the same as the method of forming the semiconductor multilayer film 150 in the first exemplary embodiment, and the layered structure of the semiconductor multilayer film 250 is generally the same as that of the semiconductor multilayer film 150. It is noted that, in accordance with the present exemplary embodiment, in the semiconductor multilayer film 250, a second mirror 104a is formed to have a film thickness that is thicker than the second mirror 104 in the semiconductor multilayer film 150 by the amount of a layer 104b. The layer 104b is used for forming the pointed section 224 in steps to be described later.

Figure 13:
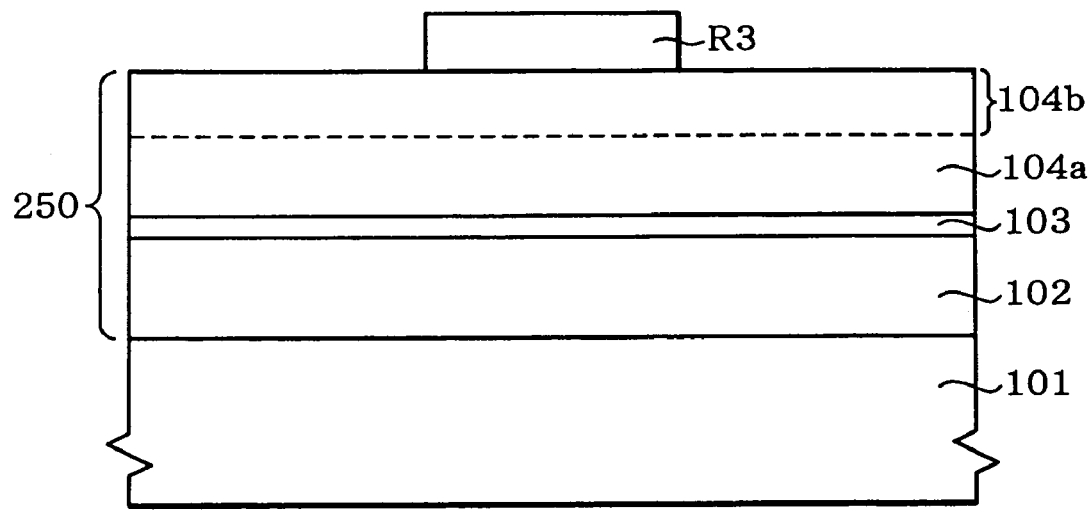
FIG. 13 is a schematic cross-sectional view showing a step of manufacturing the optical device in FIG. 11 and FIG. 12.
Figure 14:
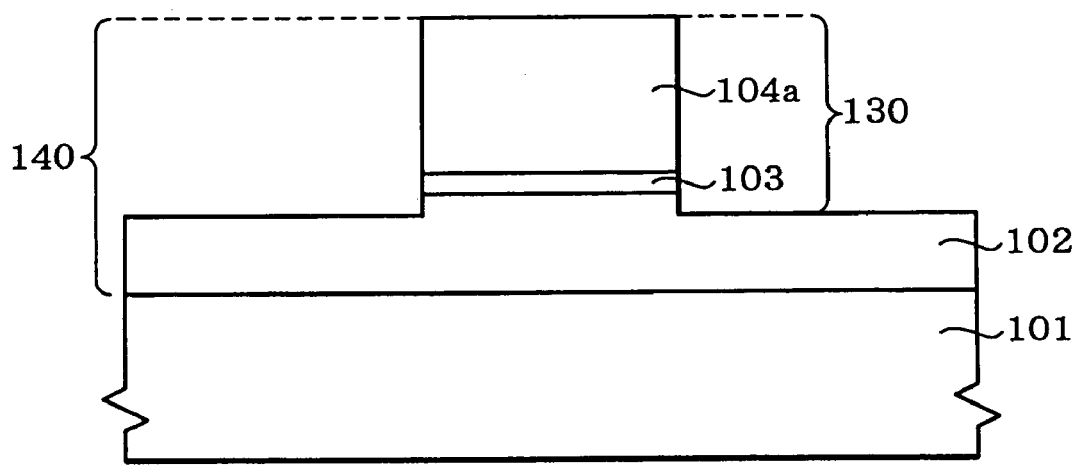
FIG. 14 is a schematic cross-sectional view showing a step of manufacturing the optical device in FIG. 11 and FIG. 12.

(2) Next, a columnar portion 130 is formed (see FIG. 14). More specifically, first, photoresist (not shown) is coated on the second mirror 104a, and then the photoresist is patterned by a photolithography method, thereby forming a resist layer R3 having a specified pattern (FIG. 13).

Next, the second mirror 104a, the active layer 103 and a part of the first mirror 102 are etched by, for example, a dry etching method, using the resist layer R3 as a mask. By this, as shown in FIG. 14, the columnar portion 130 is formed. Also, through the steps conducted so far, a device section (resonator) 140 including the columnar portion 130 is formed on the semiconductor substrate 101 (see FIG. 14). Thereafter, the resist layer R3 is removed.

Figure 15:
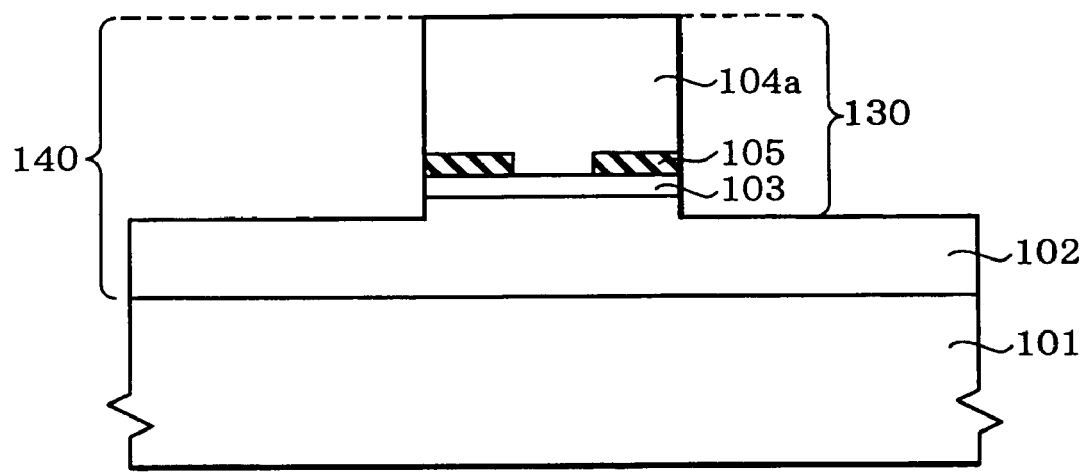
FIG. 15 is a schematic cross-sectional view showing a step of manufacturing the optical device in FIG. 11 and FIG. 12.
Figure 16:
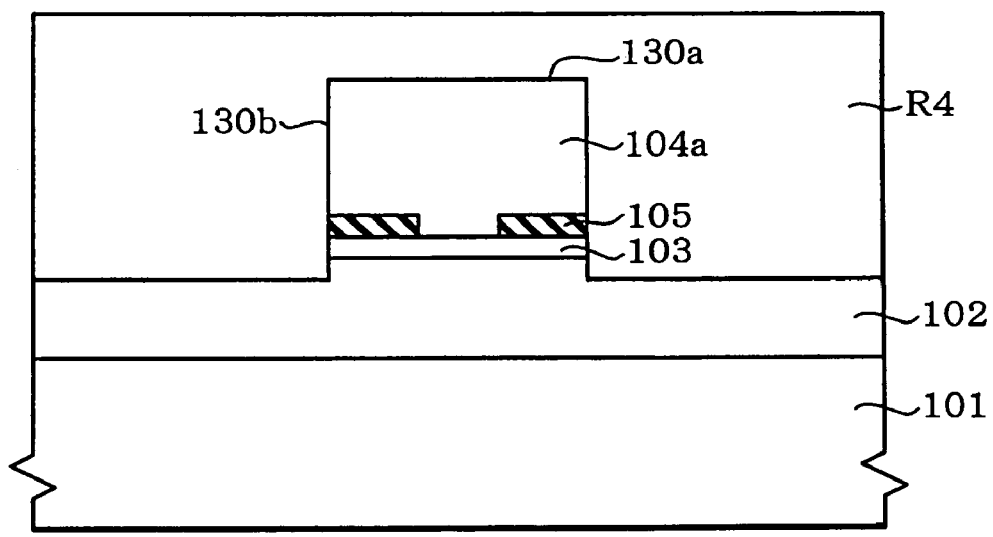
FIG. 16 is a schematic cross-sectional view showing a step of manufacturing the optical device in FIG. 11 and FIG. 12.

Next, by the same method as that of the first exemplary embodiment, a current aperture layer 105 is formed in the second mirror 104a (see FIG. 15).

(2) Next, a pointed section 224 is formed (see FIG. 16 through FIG. 20).

Figure 17:
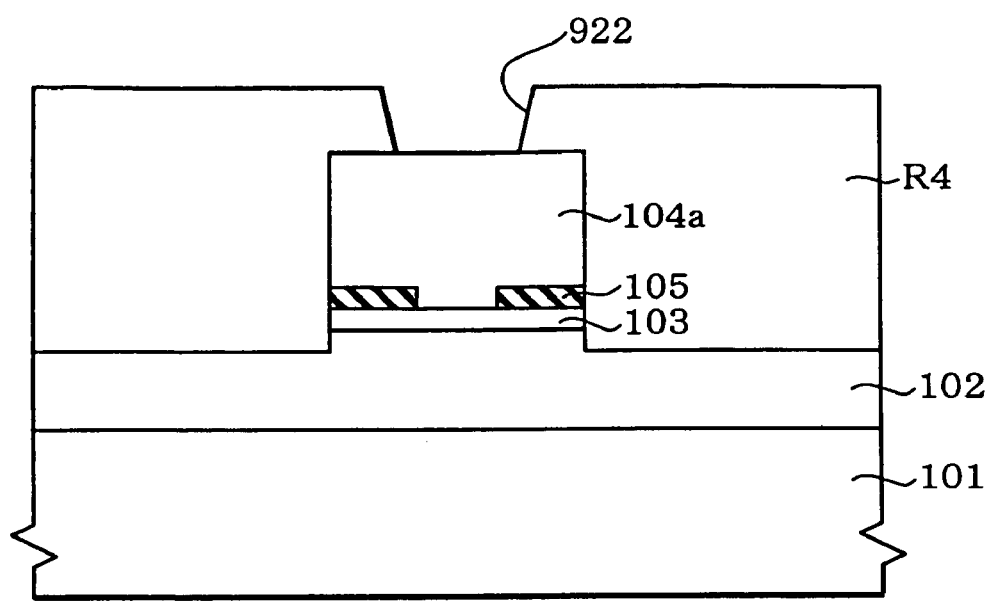
FIG. 17 is a schematic cross-sectional view showing a step of manufacturing the optical device in FIG. 11 and FIG. 12.

First, a photoresist layer R4 is coated to cover an upper surface 130a and a side wall 130b of the columnar portion 130 (see FIG. 16), and then the photoresist is patterned by a photolithography method, thereby forming a resist layer R4 having a specified pattern (see FIG. 17). The resist layer R4 includes an opening section 922 over the upper surface 130a of the columnar portion 130. Next, by using the resist layer R4 as a mask, the second mirror 104a is patterned, thereby forming an opening section 322 in the second mirror 104a (see FIG. 18). Then, the resist layer R4 is removed.

Figure 18:
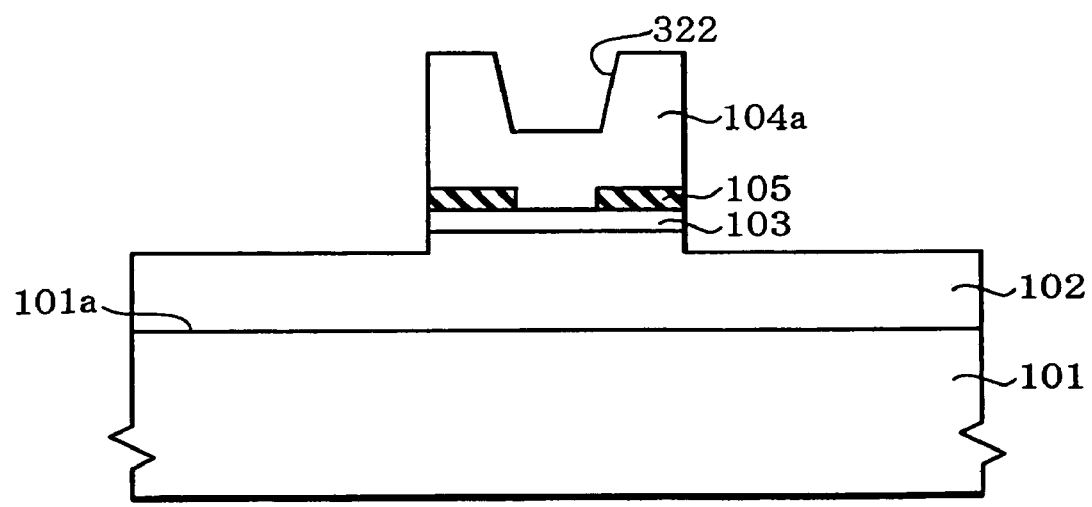
FIG. 18 is a schematic cross-sectional view showing a step of manufacturing the optical device in FIG. 11 and FIG. 12.

It is noted here that, by adjusting the baking condition, exposure condition and the like for the resist layer R4, the opening section 322 is formed to have a positively tapered configuration (see FIG. 18). In other words, the opening section 322 is formed such that, the closer the cross section thereof, which is in a plane parallel with the surface 101a of the semiconductor substrate 101, to the semiconductor substrate 101, the smaller the cross section.

Figure 19:
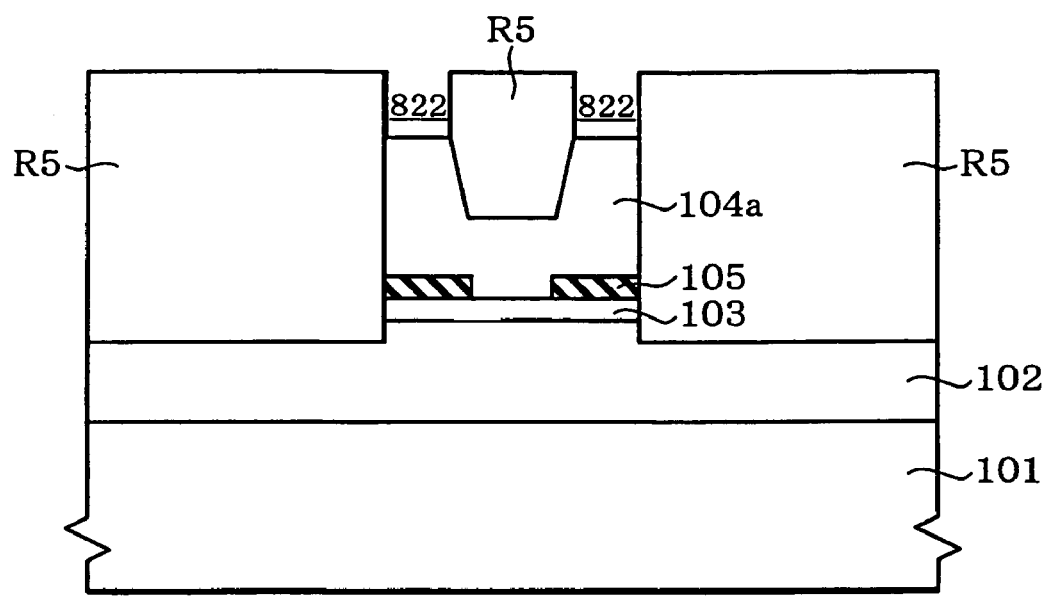
FIG. 19 is a schematic cross-sectional view showing a step of manufacturing the optical device in FIG. 11 and FIG. 12.

Next, by using a known photolithography method, a resist layer R5 having a specified pattern is formed in the opening section 322 and on the first mirror 102 (see FIG. 19). The resist layer R5 has an opening section 822 in an area over the upper surface 130a of the columnar portion 130 excluding the opening section 322 (see FIG. 19).

Figure 20:
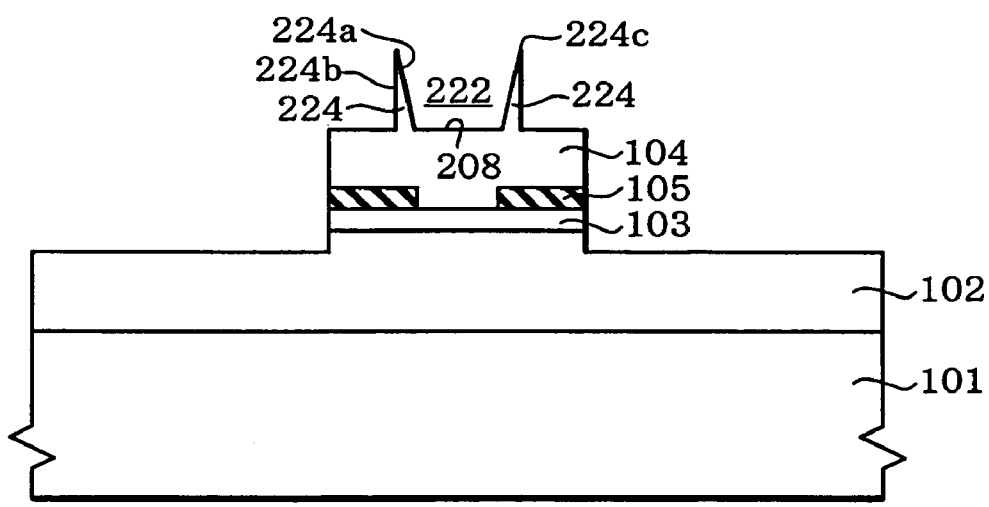
FIG. 20 is a schematic cross-sectional view showing a step of manufacturing the optical device in FIG. 11 and FIG. 12.

Then, by using the resist layer R5 as a mask, the second mirror 104a is patterned by etching, thereby forming a pointed section 244. By forming the pointed section 224, an opening section 222 is formed (FIG. 20). Next, the resist layer R5 is removed.

When the pointed section 224 is formed, for example, the time for etching may be controlled, and/or a difference between etching rates can be used. When a difference in etching rates is used, a layer (not shown) having an etching rate different from that of the layer 104a may be formed immediately below the layer 104a for forming the pointed section 224, and the etching may be stopped when the layer having the different etching rate is exposed.

It is noted that, in the present exemplary embodiment, the description is made as to a case in which the columnar portion 130 is first formed, and then the pointed section 224 is formed. However, the columnar portion 130 may be formed after forming the pointed section 224.

(3) Next, by using the same method used for the first exemplary embodiment, a dielectric layer 106, and first and second electrodes 107 and 109 are formed, and then an optical member 232 is formed. The optical member 232 can be fabricated by the same method used for the optical member 132 in the first exemplary embodiment.

By the process described above, the optical device 200 including the optical member 232 is obtained (see FIG. 11 and FIG. 12).

3. Characteristics

The optical device 200 of the present exemplary embodiment has the same characteristics as those of the optical device 100 of the first exemplary embodiment.

Figure 21A:
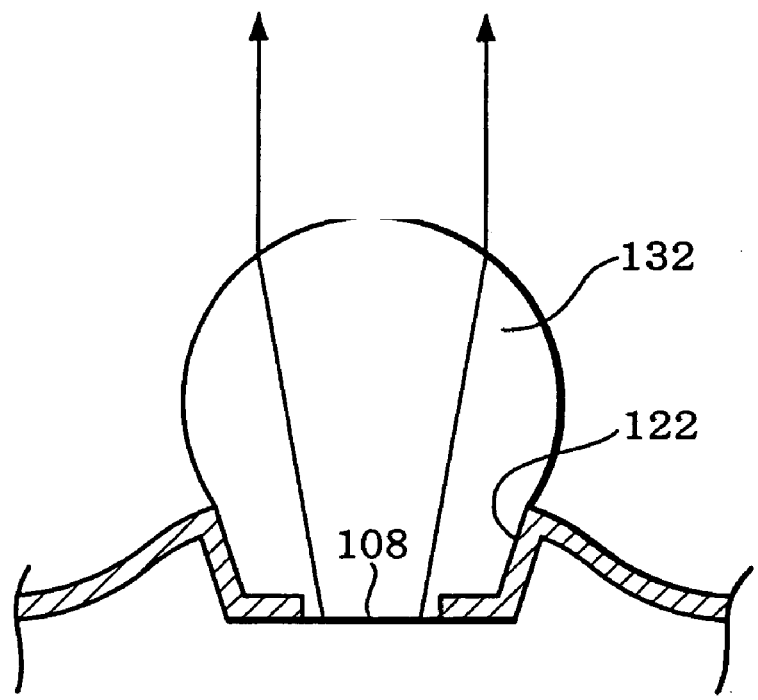
FIG. 21A is a schematic cross-sectional view showing an area adjacent to the optical member of the optical device shown in FIG. 1.
Figure 21B:
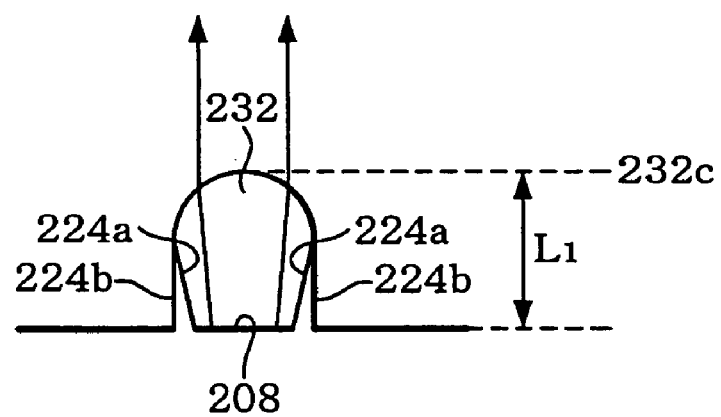
FIG. 21B is a schematic cross-sectional view showing an area adjacent to the optical member of the optical device shown in FIG. 11.

In addition, in the optical device 200 of exemplary embodiments of the present invention, the optical member 232 is provided only on the optical surface 208. Consequently, the spreading amount of light emitted from the optical member 232 can be reduced. This feature will be described with reference to FIG. 21A and FIG. 21B. FIG. 21A is a schematic cross-sectional view showing an area adjacent to the optical member 132 of the optical device 100 shown in FIG. 1, and FIG. 21B is a schematic cross-sectional view showing an area adjacent to the optical member 232 of the optical device 200 shown in FIG. 11 and FIG. 12.

The optical member 232 of the optical device 200 of the present exemplary embodiment is, as shown in FIG. 21A, provided only on the optical surface 232. For this reason, the curvature of the optical member 232 (see FIG. 21B) can be made smaller, compared to the optical member 132 (see FIG. 21A). Accordingly, as shown in FIG. 21B, the distance L1 from the optical surface 208 to the apex section 232c of the optical member 232 can be made smaller. As a result, the spreading amount of light emitted from the optical member 232 can be made smaller (see FIG. 21B). By this, when light emitted from the optical device 200 of the present exemplary embodiment is to be introduced into an optical waveguide path such as optical fiber or the like (not shown), it becomes easy to introduce the light into the optical waveguide path.

Also, in the optical device 200 of the present exemplary embodiment, the pointed section 224 is formed in one piece with the device section 140 (the second mirror 104). In other words, because the layers composing the device section 140 can be used to form the pointed section 224, the pointed section 224 can be formed by simpler steps.

4. Modified Exemplary Embodiments

Figure 22A:
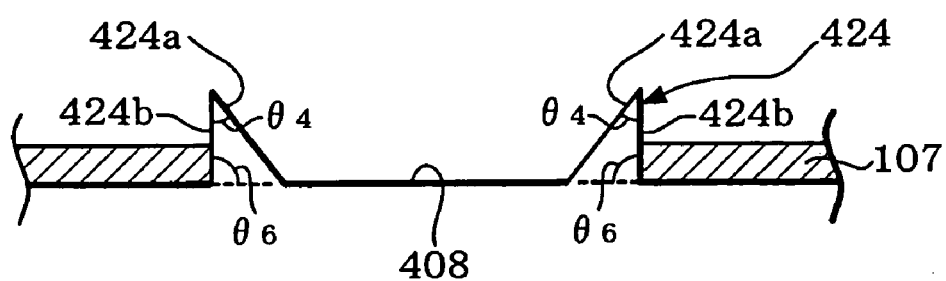
FIG. 22A and FIG. 22B are schematic cross-sectional views showing modified exemplary examples of a pointed section of the optical device shown in FIG. 11, respectively.
Figure 22B:
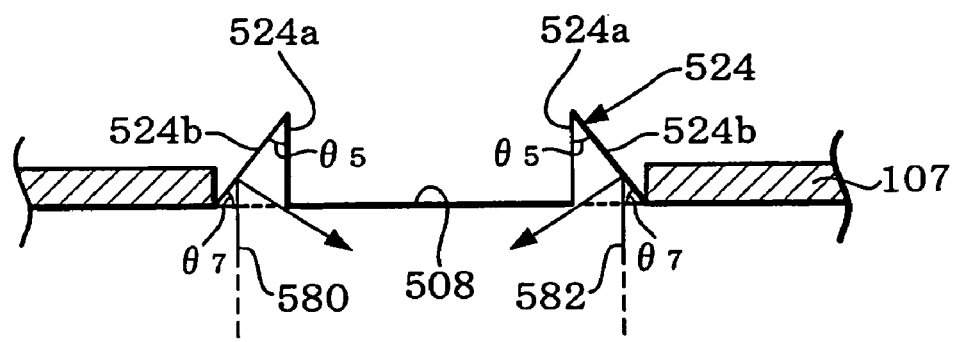

Modified exemplary examples of the optical device 200 of the present exemplary embodiment are shown in FIG. 22A and FIG. 22B. It is noted that, in FIG. 22A and FIG. 22B, enlarged views of only areas adjacent to pointed sections are schematically shown, and illustrations of optical members are omitted. FIG. 22A shows a pointed section 424, and FIG. 22B shows a pointed section 524.

The pointed section 424 includes a first surface 424a and a second surface 424b, and the first surface 424a and the second surface 424b defines an angle θ4 that is an acute angle. Similarly, the pointed section 524 includes a first surface 524a and a second surface 524b, wherein the first surface 524a and the second surface 524b intersect at an angle θ5 that is an acute angle As shown in FIG. 22A, an angle θ6 defined between the second surface 424b of the pointed section 424 and an optical surface 408 is generally a right angle. On the other hand, as shown in FIG. 22B, an angle θ7 defined between the second surface 524b of the pointed section 524 and an optical surface 508 is an acute angle. In the case of the pointed section 524, when the angle θ7 defined between the second surface 524b and the optical surface 508 is an acute angle, light generated in the active layer 103 of the device section 140 may be reflected at the second surface 524b, as shown in FIG. 22B, and is not emitted from the optical surface 508, causing the light to return to the active layer 103 (returning light). The returning light may affect driving of the device section 140. Accordingly, the configuration of the pointed section 424 is more desirable than the configuration of the pointed section 524 in view of the fact that it generates a lesser amount of returning light.

It is noted that, with respect to the pointed section 224 of the optical device 200 of the present exemplary embodiment, the second surface 224b and the optical surface 208 define an angle θ6 that is generally a right angle (see FIG. 12), like the pointed section 424 shown in FIG. 22A.

Furthermore, as in the case of the pointed section 424, when an optical member (not shown) is formed by jetting droplets against the optical surface 408 to form an optical member precursor (not shown) and hardening the same, the closer the angle θ6 defined between the second surface 424b and the optical surface 408 reaches a right angle, the more difficult it becomes for the optical member precursor to wet the second surface 424b. In other words, the optical member precursor can be more securely formed with the pointed section 424 where the angle θ6 defined between the second surface 424b and the optical surface 408 is generally a right angle rather than with the pointed section 524 where the angle θ7 defined between the second surface 524b and the optical surface 508 is an acute angle.

Third Exemplary Embodiment

1. Structure of Optical Device

FIG. 23 is a schematic cross-sectional view showing an optical device 300 in accordance with an exemplary embodiment of the present invention.

The optical device 300 of the present exemplary embodiment has a structure different from that of the optical device 100 of the first exemplary embodiment (see FIG. 1 and FIG. 2) in that an opening section 322 is provided in a back surface 101b of a semiconductor substrate 101 and an optical member 332 is provided in the opening section 322, and light is emitted from the optical member 332. Other components are generally the same as those of the optical device 100 of the first exemplary embodiment. Accordingly, in the optical device 300 of the present exemplary embodiment, components similar to those of the optical device 100 shall be appended with the same reference numbers as those of the components of the first exemplary embodiment, and their detailed description shall be omitted.

The optical device 300 of the present exemplary embodiment includes a device section 140 having an optical surface 308, a pointed section 324 that is provided in a manner to surround the optical surface 308, and an optical member 332 provided on the optical surface 308. The pointed section 324 includes a first surface 324a and a second surface 324b, and an angle θ3 defined between the first surface 324a and the second surface 324b is an acute angle. A tip 324c of the pointed section 324 defines a point of intersection between the first surface 324a and the second surface 324b, and is located at a position higher than the optical surface 308.

Also, in the optical device 300 of the present exemplary embodiment, the first surface 324a forms a side wall of a recessed section 322. Furthermore, the optical surface 308 defines a bottom surface of the recessed section 322.

Also, in the optical device 300 of the present exemplary embodiment, a first electrode 107 covers an upper surface 130a of a columnar portion 130. Also, an opening section 522 is provided in a dielectric layer 106. In the opening section 522, a second electrode 109 is provided on a second mirror 102.

2. Method of Manufacturing Optical Device

The optical device 300 of the present exemplary embodiment can be formed by a process similar to that conducted for the optical device 100 of the first exemplary embodiment. More specifically, after forming a device section 140, and forming first and second electrodes 107 and 109, a pointed section 324 and an optical member 332 can be formed.

The pointed section 324 can be obtained by patterning a back surface 101a of the semiconductor substrate 101. After forming the pointed section 324, an optical member 332 can be formed. The pointed section 324 and the optical member 332 can be formed by using methods similar to those used for forming the pointed section 124 and the optical member 132 in the first exemplary embodiment.

3. Characteristics

The optical device 300 of the present exemplary embodiment has characteristics similar to those of the optical device of the first exemplary embodiment.

In addition, with the optical device 300 of the present exemplary embodiment, light generated by the active layer 103 is emitted from the back surface 101b of the semiconductor substrate 101. Accordingly the pointed section 324 can be formed by using a process for removing the semiconductor substrate 101 by etching. Consequently, the pointed section 324 can be effectively formed.

Fourth Exemplary Embodiment

Figure 24:
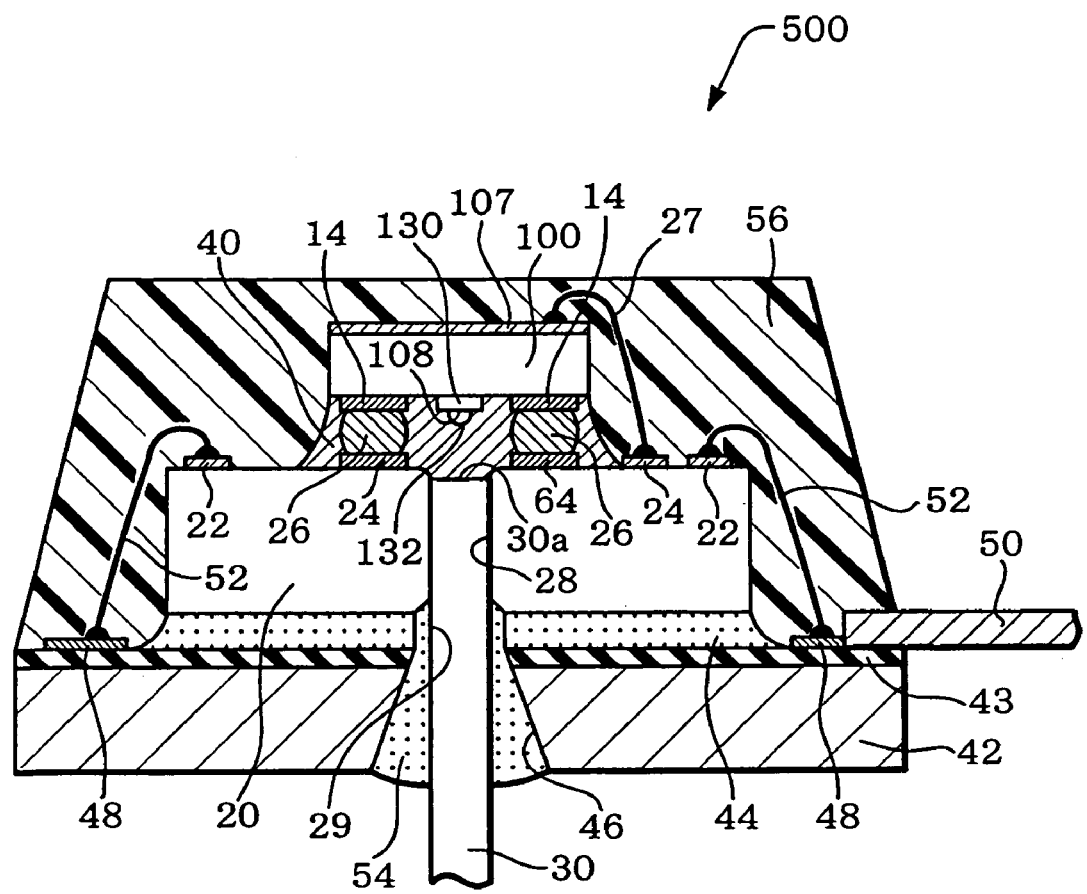
FIG. 24 is a schematic cross-sectional view showing an optical module in accordance with a fourth exemplary embodiment of the present invention.

FIG. 24 is a schematic that shows an optical module in accordance with a fourth exemplary embodiment of the present invention. The optical module 500 includes an optical device 100 of the first exemplary embodiment (see FIG. 1 and FIG. 2), a semiconductor chip 20 and an optical fiber 30. It is noted that, in the optical module 500 of the present exemplary embodiment, the same actions and effects can be obtained even when an optical device 200 of the second exemplary embodiment or an optical device 300 of the third exemplary embodiment is used instead of the optical device 100 of the first exemplary embodiment. The same applies to fifth and sixth exemplary embodiments to be described below.

1. Structure of Optical Module

The optical device 100 absorbs light that is emitted from an end face 30a of the optical fiber 30. The optical device 100 is in a state in which its position relative to the end face 30a of the optical fiber is fixed. More specifically, the optical surface 108 of the optical device 100 opposes to the end face 30a of the optical fiber 30.

The semiconductor chip 20 is provided for driving the optical device 100. In other words, the semiconductor chip 20 is provided with a built-in circuit for driving the optical device 100. The semiconductor chip 20 includes a plurality of electrodes (or pads) 22 formed therein that are electrically connected to the internal circuit. Wiring patterns 24 and 64, which are electrically connected to at least one of the electrodes 22, may preferably be formed on a surface where the electrodes 22 are formed.

The semiconductor chip 20 and the optical device 100 are electrically connected with each other. For example, a wiring pattern 14 and the wiring pattern 24 formed on the semiconductor chip 20 are electrically connected with one another through solder 26. The wiring pattern 14 is electrically connected to the second electrode 109 of the optical device 100 (not shown in FIG. 24). Also, the first electrode 107 of the optical device 100 and the wiring pattern 24 formed on the semiconductor chip 20 are electrically connected with one another through a wire 27.

The optical device 100 can be face-down mounted on the semiconductor chip 20. By so doing, the solder 26 not only provides electrical connection, but also fixes the optical device 100 and the semiconductor chip 20. It is noted that, for connection between the wiring patterns 14 and the wiring patterns 64, wires or conductive paste may be used.

An underfill material 40 may be provided between the optical device 100 and the semiconductor chip 20. When the underfill material 40 covers the optical surface 108 of the optical device 100, the underfill material 40 may preferably be transparent. The underfill material 40 covers and protects electrical connection sections between the optical device 100 and the semiconductor chip 20, and also protects the surfaces of the optical device 100 and the semiconductor chip 20. Furthermore, the underfill material 40 maintains the connected state between the optical device 100 and the semiconductor chip 20.

An aperture (for example, a through hole) 28 may be formed in the semiconductor chip 20. The optical fiber 30 is inserted in the aperture 28. The aperture 28 is formed extending from the surface where the electrodes 22 are formed to the opposite surface, while avoiding the internal circuit. A taper 29 may preferably be formed at an edge section of at least one of openings of the aperture 28. By forming the taper 29, the optical fiber 30 can be readily inserted in the aperture 28.

The semiconductor chip 20 may be attached to a substrate 42. More specifically, the semiconductor chip 20 may be attached to the substrate 42 through adhesive 44. An aperture 46 is formed in the substrate 42. The aperture 46 is formed at a position that connects to the aperture 28 of the semiconductor chip 20. The adhesive 44 that adheres the semiconductor chip 20 and the substrate 42 is provided in a manner not to disturb the continuation of the two apertures 28 and 46 and not to block them. The aperture 46 in the substrate 42 has a tapered configuration such that its inner diameter becomes greater in an opposite direction to the semiconductor chip 20. By this, the optical fiber 30 can be readily inserted.

The substrate 42 may be formed from a material that is nonconductive, such as, resin, glass, ceramics or the like, but may be formed from a material that is conductive, such as, metal or the like. When the substrate 42 is formed from a conductive material, a dielectric film 42 may preferably be formed at least on the surface on which the semiconductor chip 20 is mounted. It is noted that a material similar to that of the substrate 42 can also be used in exemplary embodiments to be described below.

Also, the substrate 42 may preferably have a high thermal conductivity. By this, the substrate 42 promotes emanation of heat of at least one of the semiconductor device 100 and the semiconductor chip 20. In this case, the substrate 42 functions as a heat sink or a heat spreader. In the present exemplary embodiment, the substrate 42 is adhered to the semiconductor chip 20, and therefore can directly cool the semiconductor chip 20. It is noted that the adhesive 44 that adheres the semiconductor chip 20 and the substrate 42 may preferably have a thermal conductivity. Furthermore, as the semiconductor chip 20 is cooled, the optical device 100 connected to the semiconductor chip 20 is also cooled.

The substrate 42 is provided with wiring patterns 48. Also, the substrate 42 is provided with external terminals 50. In the present exemplary embodiment, the external terminals 50 are leads. The wiring patterns 48 that are formed on the substrate 42 are electrically connected, for example, through wires 52, to the electrodes 22 of the semiconductor chip 20 and at least one of the wiring patterns 24 and 64 formed on the semiconductor chip 20. Also, the wiring patterns 48 may be electrically connected to the external terminals 50.

The optical fiber 30 is inserted in the aperture 28 of the semiconductor chip 20. Also, the optical fiber 30 is passed through the aperture 46 of the substrate 42. The inner diameter of the aperture 46 gradually reduces toward the aperture 28 of the semiconductor chip 20, and the inner diameter of the aperture 46 is greater than that of the optical fiber 30 on the surface opposite to the semiconductor chip 20. A gap between the optical fiber 30 and the inner surface of the aperture 46 may preferably be filled with a filler material 54 such as resin. The filler material 54 also has a function to fix and prevent the optical fiber 30 from slipping out.

Also, in the optical module of the present exemplary embodiment, the optical device 100 and the semiconductor chip 20 are sealed with resin 56. The resin 56 also seals electrically connected sections between the optical device 100 and the semiconductor chip 20 and electrically connected sections between the semiconductor chip 20 and the wiring patterns 48 formed on the substrate 42.

Fifth Exemplary Embodiment

Figure 25:
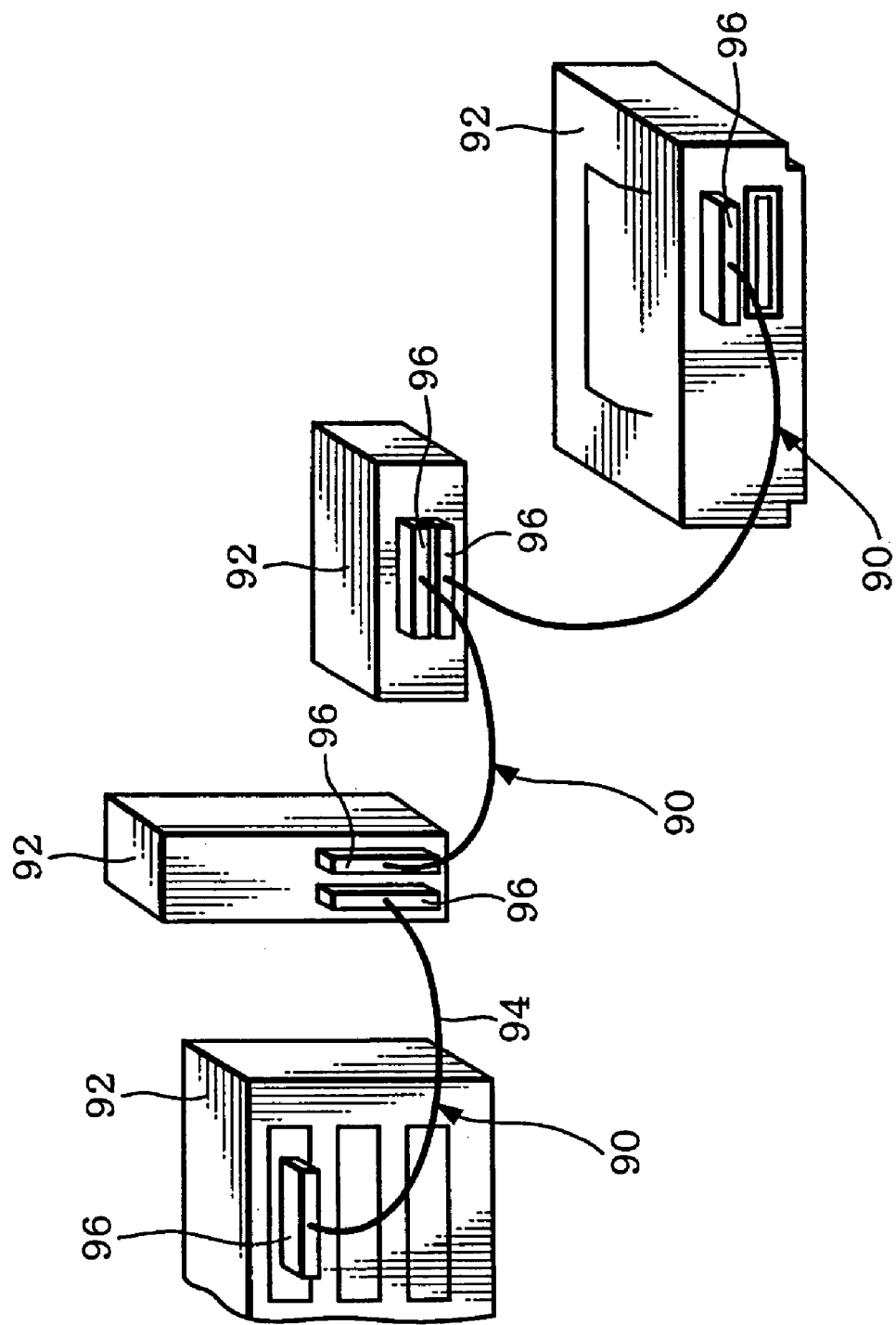
FIG. 25 is a schematic that shows optical transmission devices in accordance with a fifth exemplary embodiment of the present invention.

FIG. 25 is a schematic that shows optical transmission devices in accordance with a fifth exemplary embodiment of the present invention. The optical transmission devices 90 mutually connect electronic devices such as a computer, display device, storage device, printer and the like. The electronic devices 92 may be information communication devices. The optical transmission device 90 may include a cable 94 and plugs 96 provided on both sides of the cable 94. The cable 94 includes an optical fiber 30 (see FIG. 24). The plug 96 includes on its inside an optical device 100 and a semiconductor chip 20. It is noted that the optical fiber 30 is provided inside the cable 94, and the optical device 100 and the semiconductor chip 20 are provided inside the plug 96, and therefore they are not shown in FIG. 25. The optical fiber 30 and the optical device 100 are attached in a manner described in the fourth exemplary embodiment.

The optical device 100 of the first exemplary embodiment is provided at one end of the optical fiber 30, and a photodetector (not shown) is provided at the other end of the optical fiber 30. The photodetector converts inputted optical signals into electrical signals, and then provides the electrical signals to an electronic device 92 on one side. On the other hand, electrical signals outputted from the electronic device 92 are converted by the optical device 100 into optical signals. The optical signals are transmitted through the optical fiber 30 and inputted in the photodetector. It is noted that the photodetector may be a photodetector to which exemplary embodiments of the present invention are applied.

As described above, with the optical transmission device 90 of the present exemplary embodiment, information can be transmitted among the electronic devices 92 by optical signals.

Sixth Exemplary Embodiment

Figure 26:
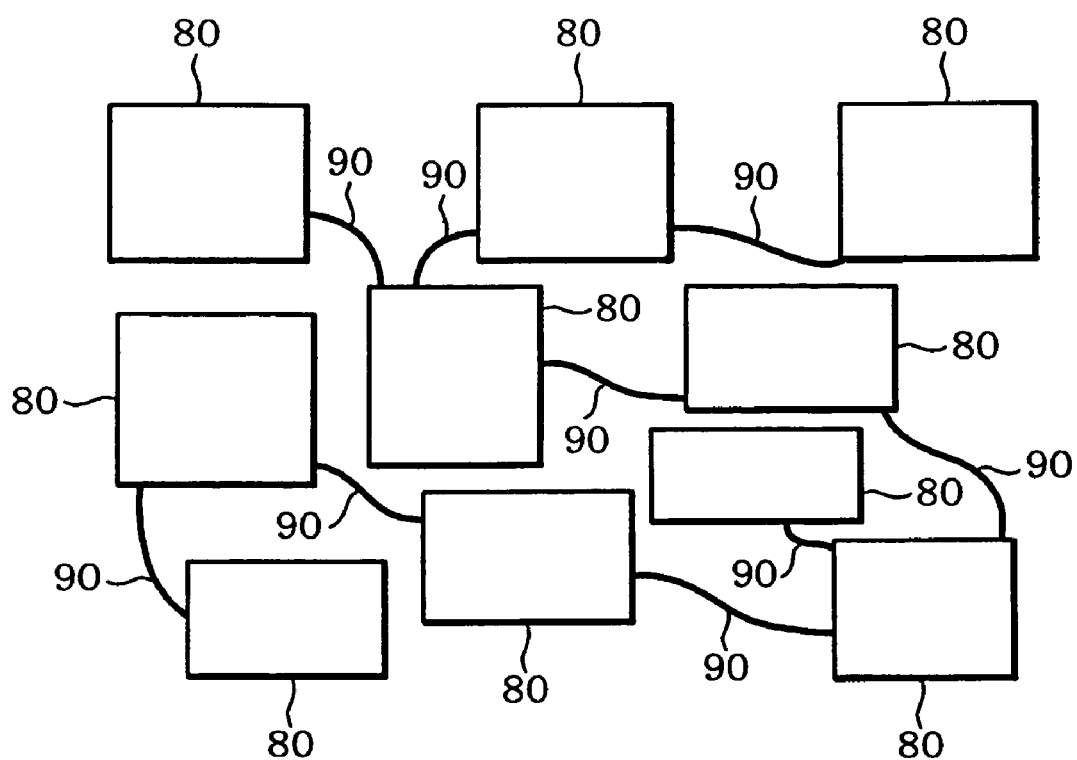
FIG. 26 is a schematic that shows a usage configuration of optical transmission devices in accordance with a sixth exemplary embodiment of the present invention.

FIG. 26 is a schematic that shows a usage configuration of optical transmission devices in accordance with a sixth exemplary embodiment of the present invention. Optical transmission devices 90 connect electronic devices 80. The electronic devices 80 include, for example, liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale) scanning), videos, tuners, gaming devices, printers and the like.

The present invention is not limited to the exemplary embodiments described above, and many exemplary modifications can be made. For example, exemplary embodiments of the present invention may include compositions that are substantially the same as the compositions described in the embodiments (for example, a composition with the same function, method and result, or a composition with the same objects and result). Also, exemplary embodiments of the present invention include compositions in which portions not essential in the compositions described in the exemplary embodiments are replaced with others. Also, exemplary embodiments of the present invention include compositions that can address or achieve the same or similar functions and effects or address or achieve the same objects of those of the compositions described in the exemplary embodiments. Furthermore, exemplary embodiments of the present invention includes compositions that include publicly known technology added to the compositions described in the exemplary embodiments.

For example, in the exemplary embodiments described above, a surface-emitting type light emission device having one columnar portion is described. However, the exemplary embodiments of the present invention can include a plurality of columnar portions provided in a substrate surface. Also, similar functions and effects are obtained even when a plurality of surface-emitting type light emission devices are provided in an array.

Also, it should be noted that, for example, interchanging the p-type and n-type characteristics of each of the semiconductor layers in the above described exemplary embodiments does not deviate from the subject matter of exemplary embodiments of the present invention. In the above described exemplary embodiments, the description is made as to an AlGaAs type, but depending on the oscillation wavelength to be generated, other materials, such as, for example, GaInP type, ZnSSe type, InGaN type, AlGaN type, InGaAs type, GaInNAs type, GaAsSb type, and like semiconductor materials can be used.

What is claimed is:

1. A method for manufacturing an optical device, comprising:
   forming a device section having an optical surface;
   forming a pointed section that surrounds the optical surface, an upper portion of a dielectric layer forming a part of the pointed section;
   forming an optical member precursor by jetting droplets to the optical surface; and
   forming an optical member by hardening the optical member precursor,
   wherein, the pointed section comprises:
      a first surface and a second surface, the first surface and the second surface defining an acute angle.

2. The method for manufacturing an optical device according to claim 1, the jetting of the droplets being conducted by an ink jet method.

3. The method for manufacturing an optical device according to claim 1, the hardening of the optical member precursor being conducted by application of energy.

4. The method for manufacturing an optical device according to claim 1, wherein, the pointed section comprises:
   the first surface and a second surface, the first surface and the second surface intercepting the optical surface at obtuse angles.

5. A method for manufacturing an optical device, comprising:
   forming a device section having an optical surface;
   forming a pointed section that surrounds the optical surface, an upper portion of a dielectric layer forming a part of the pointed section;
   forming an optical member precursor by jetting droplets to the optical surface; and
   forming an optical member by hardening the optical member precursor,
   wherein, a surface of the pointed section is an electrode.

6. The method for manufacturing an optical device according to claim 5, the jetting of the droplets being conducted by an ink jet method.

7. The method for manufacturing an optical device according to claim 5, the hardening of the optical member precursor being conducted by application of energy.

8. The method for manufacturing an optical device according to claim 5, wherein, the pointed section comprises:

a first surface and a second surface, the first surface and the second surface intercepting the optical surface at obtuse angles.

* * * * *